(12) United States Patent
Lee et al.

(10) Patent No.: US 8,970,289 B1
(45) Date of Patent: Mar. 3, 2015

(54) CIRCUITS AND DEVICES FOR GENERATING BI-DIRECTIONAL BODY BIAS VOLTAGES, AND METHODS THEREFOR

(71) Applicant: Suvolta, Inc., Los Gatos, CA (US)

(72) Inventors: Sang-Soo Lee, Cupertino, CA (US);
Edward J. Boling, Fremont, CA (US);
Augustine Kuo, Berkeley, CA (US);
Robert Rogenmoser, Santa Clara, CA (US)

(73) Assignee: Suvolta, Inc., Los Gatos, CA (US)

( * ) Notice: Subject to any disclaimer, the term of this patent is extended or adjusted under 35 U.S.C. 154(b) by 0 days.

(21) Appl. No.: 13/747,268

(22) Filed: Jan. 22, 2013

Related U.S. Application Data

(60) Provisional application No. 61/589,802, filed on Jan. 23, 2012.

(51) Int. Cl.
*G05F 1/575* (2006.01)
*G05F 1/46* (2006.01)
*G05F 3/02* (2006.01)

(52) U.S. Cl.
CPC ....................................... *G05F 3/02* (2013.01)
USPC ......................................................... 327/534

(58) Field of Classification Search
None
See application file for complete search history.

(56) References Cited

U.S. PATENT DOCUMENTS

| | | | |
|---|---|---|---|
| 3,958,266 A | 5/1976 | Athanas | |
| 4,000,504 A | 12/1976 | Berger | |
| 4,021,835 A | 5/1977 | Etoh et al. | |
| 4,242,691 A | 12/1980 | Kotani et al. | |
| 4,276,095 A | 6/1981 | Beilstein, Jr. et al. | |
| 4,315,781 A | 2/1982 | Henderson | |
| 4,518,926 A | 5/1985 | Swanson | |
| 4,559,091 A | 12/1985 | Allen et al. | |
| 4,578,128 A | 3/1986 | Mundt et al. | |

(Continued)

FOREIGN PATENT DOCUMENTS

| | | | |
|---|---|---|---|
| EP | 0274278 | * 7/1988 | ............. H01L 29/10 |
| EP | 0312237 A2 | 4/1989 | |

(Continued)

OTHER PUBLICATIONS

English Translation of JP 08153873, Jun. 11, 1996.*

(Continued)

*Primary Examiner* — Lincoln Donovan
*Assistant Examiner* — Terry L Englund

(57) ABSTRACT

An integrated circuit device can include at least a first bi-directional biasing circuit having a first substrate portion containing a plurality of first transistors; a first control digital-to-analog converter (DAC) to generate any of a plurality of first target values in response to a first target code; a first detect circuit configured to generate a difference value between the first target values and a first limit value; and at least a first charge pump circuit configured to drive the first substrate portion between a forward body bias voltage and a reverse body bias voltage for the first transistors in response to first target values. Embodiments can also include a performance monitor section configured to determine a difference between the voltage of the first substrate portion and a target voltage. Control logic can generate first code values in response to the difference between the voltage of the first substrate portion and the target voltage. Methods are also disclosed.

20 Claims, 14 Drawing Sheets

(56) References Cited

U.S. PATENT DOCUMENTS

| | | |
|---|---|---|
| 4,617,066 A | 10/1986 | Vasudev |
| 4,662,061 A | 5/1987 | Malhi |
| 4,761,384 A | 8/1988 | Neppl et al. |
| 4,780,748 A | 10/1988 | Cunningham et al. |
| 4,819,043 A | 4/1989 | Yazawa et al. |
| 4,885,477 A | 12/1989 | Bird et al. |
| 4,908,681 A | 3/1990 | Nishida et al. |
| 4,945,254 A | 7/1990 | Robbins |
| 4,956,311 A | 9/1990 | Liou et al. |
| 5,034,337 A | 7/1991 | Mosher et al. |
| 5,144,378 A | 9/1992 | Hikosaka |
| 5,156,989 A | 10/1992 | Williams et al. |
| 5,156,990 A | 10/1992 | Mitchell |
| 5,166,765 A | 11/1992 | Lee et al. |
| 5,208,473 A | 5/1993 | Komori et al. |
| 5,294,821 A | 3/1994 | Iwamatsu |
| 5,298,763 A | 3/1994 | Shen et al. |
| 5,369,288 A | 11/1994 | Usuki |
| 5,373,186 A | 12/1994 | Schubert et al. |
| 5,384,476 A | 1/1995 | Nishizawa et al. |
| 5,426,328 A | 6/1995 | Yilmaz et al. |
| 5,444,008 A | 8/1995 | Han et al. |
| 5,552,332 A | 9/1996 | Tseng et al. |
| 5,559,368 A | 9/1996 | Hu et al. |
| 5,608,253 A | 3/1997 | Liu et al. |
| 5,622,880 A | 4/1997 | Burr et al. |
| 5,624,863 A | 4/1997 | Helm et al. |
| 5,625,568 A | 4/1997 | Edwards et al. |
| 5,641,980 A | 6/1997 | Yamaguchi et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,726,562 A | 3/1998 | Mizuno |
| 5,731,626 A | 3/1998 | Eaglesham et al. |
| 5,736,419 A | 4/1998 | Naem |
| 5,753,555 A | 5/1998 | Hada |
| 5,754,826 A | 5/1998 | Gamal et al. |
| 5,756,365 A | 5/1998 | Kakumu |
| 5,763,921 A | 6/1998 | Okumura et al. |
| 5,780,899 A | 7/1998 | Hu et al. |
| 5,847,419 A | 12/1998 | Imai et al. |
| 5,861,334 A | 1/1999 | Rho |
| 5,865,003 A | 2/1999 | Klett et al. |
| 5,877,049 A | 3/1999 | Liu et al. |
| 5,885,876 A | 3/1999 | Dennen |
| 5,889,315 A | 3/1999 | Farrenkopf et al. |
| 5,895,954 A | 4/1999 | Yasumura et al. |
| 5,899,714 A | 5/1999 | Farrenkopf et al. |
| 5,918,129 A | 6/1999 | Fulford, Jr. et al. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin et al. |
| 5,985,705 A | 11/1999 | Seliskar |
| 5,989,963 A | 11/1999 | Luning et al. |
| 6,001,695 A | 12/1999 | Wu |
| 6,020,227 A | 2/2000 | Bulucea |
| 6,043,139 A | 3/2000 | Eaglesham et al. |
| 6,060,345 A | 5/2000 | Hause et al. |
| 6,060,364 A | 5/2000 | Maszara et al. |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,153,920 A | 11/2000 | Gossmann et al. |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,198,157 B1 | 3/2001 | Ishida et al. |
| 6,218,892 B1 | 4/2001 | Soumyanath et al. |
| 6,218,895 B1 | 4/2001 | De et al. |
| 6,221,724 B1 | 4/2001 | Yu et al. |
| 6,229,188 B1 | 5/2001 | Aoki et al. |
| 6,232,164 B1 | 5/2001 | Tsai et al. |
| 6,232,793 B1 | 5/2001 | Arimoto et al. |
| 6,235,597 B1 | 5/2001 | Miles |
| 6,245,618 B1 | 6/2001 | An et al. |
| 6,268,640 B1 | 7/2001 | Park et al. |
| 6,271,070 B2 | 8/2001 | Kotani et al. |
| 6,271,551 B1 | 8/2001 | Schmitz et al. |
| 6,288,429 B1 | 9/2001 | Iwata et al. |
| 6,297,132 B1 | 10/2001 | Zhang et al. |
| 6,300,177 B1 | 10/2001 | Sundaresan et al. |
| 6,313,489 B1 | 11/2001 | Letavic et al. |
| 6,319,799 B1 | 11/2001 | Ouyang et al. |
| 6,320,222 B1 | 11/2001 | Forbes et al. |
| 6,323,525 B1 | 11/2001 | Noguchi et al. |
| 6,326,666 B1 | 12/2001 | Bernstein et al. |
| 6,335,233 B1 | 1/2002 | Cho et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,260 B1 | 7/2002 | Hshieh |
| 6,426,279 B1 | 7/2002 | Huster et al. |
| 6,432,754 B1 | 8/2002 | Assaderaghi et al. |
| 6,444,550 B1 | 9/2002 | Hao et al. |
| 6,444,551 B1 | 9/2002 | Ku et al. |
| 6,449,749 B1 | 9/2002 | Stine |
| 6,461,920 B1 | 10/2002 | Shirahata et al. |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,503,805 B2 | 1/2003 | Wang et al. |
| 6,506,640 B1 | 1/2003 | Ishida et al. |
| 6,518,623 B1 | 2/2003 | Oda et al. |
| 6,521,470 B1 | 2/2003 | Lin et al. |
| 6,534,373 B1 | 3/2003 | Yu |
| 6,541,328 B2 | 4/2003 | Whang et al. |
| 6,541,829 B2 | 4/2003 | Nishinohara et al. |
| 6,548,842 B1 | 4/2003 | Bulucea et al. |
| 6,551,885 B1 | 4/2003 | Yu |
| 6,552,377 B1 | 4/2003 | Yu |
| 6,573,129 B2 | 6/2003 | Hoke et al. |
| 6,576,535 B2 | 6/2003 | Drobny et al. |
| 6,600,200 B1 | 7/2003 | Lustig et al. |
| 6,620,671 B1 | 9/2003 | Wang et al. |
| 6,624,488 B1 | 9/2003 | Kim |
| 6,627,473 B1 | 9/2003 | Oikawa et al. |
| 6,630,710 B1 | 10/2003 | Augusto |
| 6,660,605 B1 | 12/2003 | Liu |
| 6,662,350 B2 | 12/2003 | Fried et al. |
| 6,667,200 B2 | 12/2003 | Sohn et al. |
| 6,670,260 B1 | 12/2003 | Yu et al. |
| 6,693,333 B1 | 2/2004 | Yu |
| 6,730,568 B2 | 5/2004 | Sohn |
| 6,737,724 B2 | 5/2004 | Hieda et al. |
| 6,743,291 B2 | 6/2004 | Ang et al. |
| 6,743,684 B2 | 6/2004 | Liu |
| 6,744,301 B2 | 6/2004 | Tschanz et al. |
| 6,751,519 B1 | 6/2004 | Satya et al. |
| 6,753,230 B2 | 6/2004 | Sohn et al. |
| 6,760,900 B2 | 7/2004 | Rategh et al. |
| 6,770,944 B2 | 8/2004 | Nishinohara et al. |
| 6,787,424 B1 | 9/2004 | Yu |
| 6,797,553 B2 | 9/2004 | Adkisson et al. |
| 6,797,602 B1 | 9/2004 | Kluth et al. |
| 6,797,994 B1 | 9/2004 | Hoke et al. |
| 6,808,004 B2 | 10/2004 | Kamm et al. |
| 6,808,994 B1 | 10/2004 | Wang |
| 6,813,750 B2 | 11/2004 | Usami et al. |
| 6,821,825 B2 | 11/2004 | Todd et al. |

(56) References Cited

U.S. PATENT DOCUMENTS

| | | | |
|---|---|---|---|
| 6,821,852 B2 | 11/2004 | Rhodes | |
| 6,822,297 B2 | 11/2004 | Nandakumar et al. | |
| 6,831,292 B2 | 12/2004 | Currie et al. | |
| 6,835,639 B2 | 12/2004 | Rotondaro et al. | |
| 6,852,602 B2 | 2/2005 | Kanzawa et al. | |
| 6,852,603 B2 | 2/2005 | Chakravarthi et al. | |
| 6,867,637 B2 * | 3/2005 | Miyazaki et al. | 327/534 |
| 6,881,641 B2 | 4/2005 | Wieczorek et al. | |
| 6,881,987 B2 | 4/2005 | Sohn | |
| 6,891,439 B2 | 5/2005 | Jaehne et al. | |
| 6,893,947 B2 | 5/2005 | Martinez et al. | |
| 6,900,519 B2 | 5/2005 | Cantell et al. | |
| 6,901,564 B2 | 5/2005 | Stine et al. | |
| 6,916,698 B2 | 7/2005 | Mocuta et al. | |
| 6,917,237 B1 | 7/2005 | Tschanz et al. | |
| 6,927,463 B2 | 8/2005 | Iwata et al. | |
| 6,928,128 B1 | 8/2005 | Sidiropoulos | |
| 6,930,007 B2 | 8/2005 | Bu et al. | |
| 6,930,360 B2 | 8/2005 | Yamauchi et al. | |
| 6,957,163 B2 | 10/2005 | Ando | |
| 6,963,090 B2 | 11/2005 | Passlack et al. | |
| 6,995,397 B2 | 2/2006 | Yamashita et al. | |
| 7,002,214 B1 | 2/2006 | Boyd et al. | |
| 7,008,836 B2 | 3/2006 | Algotsson et al. | |
| 7,013,359 B1 | 3/2006 | Li | |
| 7,015,546 B2 | 3/2006 | Herr et al. | |
| 7,015,741 B2 | 3/2006 | Tschanz et al. | |
| 7,022,559 B2 | 4/2006 | Barnak et al. | |
| 7,036,098 B2 | 4/2006 | Eleyan et al. | |
| 7,038,258 B2 | 5/2006 | Liu et al. | |
| 7,039,881 B2 | 5/2006 | Regan | |
| 7,045,456 B2 | 5/2006 | Murto et al. | |
| 7,057,216 B2 | 6/2006 | Ouyang et al. | |
| 7,061,058 B2 | 6/2006 | Chakravarthi et al. | |
| 7,064,039 B2 | 6/2006 | Liu | |
| 7,064,399 B2 | 6/2006 | Babcock et al. | |
| 7,071,103 B2 | 7/2006 | Chan et al. | |
| 7,078,325 B2 | 7/2006 | Curello et al. | |
| 7,078,776 B2 | 7/2006 | Nishinohara et al. | |
| 7,089,513 B2 | 8/2006 | Bard et al. | |
| 7,089,515 B2 | 8/2006 | Hanafi et al. | |
| 7,091,093 B1 | 8/2006 | Noda et al. | |
| 7,105,399 B1 | 9/2006 | Dakshina-Murthy et al. | |
| 7,109,099 B2 | 9/2006 | Tan et al. | |
| 7,119,381 B2 | 10/2006 | Passlack | |
| 7,122,411 B2 | 10/2006 | Mouli | |
| 7,127,687 B1 | 10/2006 | Signore | |
| 7,132,323 B2 | 11/2006 | Haensch et al. | |
| 7,169,675 B2 | 1/2007 | Tan et al. | |
| 7,170,120 B2 | 1/2007 | Datta et al. | |
| 7,176,137 B2 | 2/2007 | Perng et al. | |
| 7,186,598 B2 | 3/2007 | Yamauchi et al. | |
| 7,189,627 B2 | 3/2007 | Wu et al. | |
| 7,199,430 B2 | 4/2007 | Babcock et al. | |
| 7,202,517 B2 | 4/2007 | Dixit et al. | |
| 7,208,354 B2 | 4/2007 | Bauer | |
| 7,211,871 B2 | 5/2007 | Cho | |
| 7,221,021 B2 | 5/2007 | Wu et al. | |
| 7,223,646 B2 | 5/2007 | Miyashita et al. | |
| 7,226,833 B2 | 6/2007 | White et al. | |
| 7,226,843 B2 | 6/2007 | Weber et al. | |
| 7,230,680 B2 | 6/2007 | Fujisawa et al. | |
| 7,235,822 B2 | 6/2007 | Li | |
| 7,256,639 B1 | 8/2007 | Koniaris et al. | |
| 7,259,428 B2 | 8/2007 | Inaba | |
| 7,260,562 B2 | 8/2007 | Czajkowski et al. | |
| 7,268,612 B2 * | 9/2007 | Senda et al. | 327/536 |
| 7,294,877 B2 | 11/2007 | Rueckes et al. | |
| 7,297,994 B2 | 11/2007 | Wieczorek et al. | |
| 7,301,208 B2 | 11/2007 | Handa et al. | |
| 7,304,350 B2 | 12/2007 | Misaki | |
| 7,307,471 B2 | 12/2007 | Gammie et al. | |
| 7,312,500 B2 | 12/2007 | Miyashita et al. | |
| 7,323,754 B2 | 1/2008 | Ema et al. | |
| 7,332,439 B2 | 2/2008 | Lindert et al. | |
| 7,348,629 B2 | 3/2008 | Chu et al. | |
| 7,354,833 B2 | 4/2008 | Liaw | |
| 7,380,225 B2 | 5/2008 | Joshi et al. | |
| 7,398,497 B2 | 7/2008 | Sato et al. | |
| 7,402,207 B1 | 7/2008 | Besser et al. | |
| 7,402,872 B2 | 7/2008 | Murthy et al. | |
| 7,416,605 B2 | 8/2008 | Zollner et al. | |
| 7,427,788 B2 | 9/2008 | Li et al. | |
| 7,442,971 B2 | 10/2008 | Wirbeleit et al. | |
| 7,449,733 B2 | 11/2008 | Inaba et al. | |
| 7,462,908 B2 | 12/2008 | Bol et al. | |
| 7,469,164 B2 | 12/2008 | Du-Nour | |
| 7,470,593 B2 | 12/2008 | Rouh et al. | |
| 7,485,536 B2 | 2/2009 | Jin et al. | |
| 7,487,474 B2 | 2/2009 | Ciplickas et al. | |
| 7,491,988 B2 | 2/2009 | Tolchinsky et al. | |
| 7,494,861 B2 | 2/2009 | Chu et al. | |
| 7,496,862 B2 | 2/2009 | Chang et al. | |
| 7,496,867 B2 | 2/2009 | Turner et al. | |
| 7,498,637 B2 | 3/2009 | Yamaoka et al. | |
| 7,501,324 B2 | 3/2009 | Babcock et al. | |
| 7,503,020 B2 | 3/2009 | Allen et al. | |
| 7,507,999 B2 | 3/2009 | Kusumoto et al. | |
| 7,514,766 B2 | 4/2009 | Yoshida | |
| 7,514,953 B2 | 4/2009 | Perisetty | |
| 7,521,323 B2 | 4/2009 | Surdeanu et al. | |
| 7,531,393 B2 | 5/2009 | Doyle et al. | |
| 7,531,836 B2 | 5/2009 | Liu et al. | |
| 7,538,364 B2 | 5/2009 | Twynam | |
| 7,538,412 B2 | 5/2009 | Schulze et al. | |
| 7,551,019 B2 * | 6/2009 | Fujita et al. | 327/537 |
| 7,562,233 B1 | 7/2009 | Sheng et al. | |
| 7,564,105 B2 | 7/2009 | Chi et al. | |
| 7,566,600 B2 | 7/2009 | Mouli | |
| 7,569,456 B2 | 8/2009 | Ko et al. | |
| 7,586,322 B1 | 9/2009 | Xu et al. | |
| 7,592,241 B2 | 9/2009 | Takao | |
| 7,595,243 B1 | 9/2009 | Bulucea et al. | |
| 7,598,142 B2 | 10/2009 | Ranade et al. | |
| 7,605,041 B2 | 10/2009 | Ema et al. | |
| 7,605,060 B2 | 10/2009 | Meunier-Beillard et al. | |
| 7,605,429 B2 | 10/2009 | Bernstein et al. | |
| 7,608,496 B2 | 10/2009 | Chu | |
| 7,615,802 B2 | 11/2009 | Elpelt et al. | |
| 7,622,341 B2 | 11/2009 | Chudzik et al. | |
| 7,638,380 B2 | 12/2009 | Pearce | |
| 7,642,140 B2 | 1/2010 | Bae et al. | |
| 7,644,377 B1 | 1/2010 | Saxe et al. | |
| 7,645,665 B2 | 1/2010 | Kubo et al. | |
| 7,651,920 B2 | 1/2010 | Siprak | |
| 7,655,523 B2 | 2/2010 | Babcock et al. | |
| 7,673,273 B2 | 3/2010 | Madurawe et al. | |
| 7,675,126 B2 | 3/2010 | Cho | |
| 7,675,317 B2 | 3/2010 | Perisetty | |
| 7,678,638 B2 | 3/2010 | Chu et al. | |
| 7,681,628 B2 | 3/2010 | Joshi et al. | |
| 7,682,887 B2 | 3/2010 | Dokumaci et al. | |
| 7,683,442 B1 | 3/2010 | Burr et al. | |
| 7,696,000 B2 | 4/2010 | Liu et al. | |
| 7,704,822 B2 | 4/2010 | Jeong | |
| 7,704,844 B2 | 4/2010 | Zhu et al. | |
| 7,709,828 B2 | 5/2010 | Braithwaite et al. | |
| 7,723,750 B2 | 5/2010 | Zhu et al. | |
| 7,737,472 B2 | 6/2010 | Kondo et al. | |
| 7,741,138 B2 | 6/2010 | Cho | |
| 7,741,200 B2 | 6/2010 | Cho et al. | |
| 7,745,270 B2 | 6/2010 | Shah et al. | |
| 7,750,374 B2 | 7/2010 | Capasso et al. | |
| 7,750,381 B2 | 7/2010 | Hokazono et al. | |
| 7,750,405 B2 | 7/2010 | Nowak | |
| 7,750,682 B2 | 7/2010 | Bernstein et al. | |
| 7,755,144 B2 | 7/2010 | Li et al. | |
| 7,755,146 B2 | 7/2010 | Helm et al. | |
| 7,759,206 B2 | 7/2010 | Luo et al. | |
| 7,759,714 B2 | 7/2010 | Itoh et al. | |
| 7,761,820 B2 | 7/2010 | Berger et al. | |
| 7,795,677 B2 | 9/2010 | Bangsaruntip et al. | |
| 7,808,045 B2 | 10/2010 | Kawahara et al. | |
| 7,808,410 B2 | 10/2010 | Kim et al. | |

(56) References Cited

U.S. PATENT DOCUMENTS

| | | | |
|---|---|---|---|
| 7,811,873 B2 | 10/2010 | Mochizuki | |
| 7,811,881 B2 | 10/2010 | Cheng et al. | |
| 7,816,936 B2 * | 10/2010 | Ito | 324/750.3 |
| 7,818,702 B2 | 10/2010 | Mandelman et al. | |
| 7,821,066 B2 | 10/2010 | Lebby et al. | |
| 7,829,402 B2 | 11/2010 | Matocha et al. | |
| 7,831,873 B1 | 11/2010 | Trimberger et al. | |
| 7,846,822 B2 | 12/2010 | Seebauer et al. | |
| 7,855,118 B2 | 12/2010 | Hoentschel et al. | |
| 7,859,013 B2 | 12/2010 | Chen et al. | |
| 7,863,163 B2 | 1/2011 | Bauer | |
| 7,867,835 B2 | 1/2011 | Lee et al. | |
| 7,883,977 B2 | 2/2011 | Babcock et al. | |
| 7,888,205 B2 | 2/2011 | Herner et al. | |
| 7,888,747 B2 | 2/2011 | Hokazono | |
| 7,895,546 B2 | 2/2011 | Lahner et al. | |
| 7,897,495 B2 | 3/2011 | Ye et al. | |
| 7,906,413 B2 | 3/2011 | Cardone et al. | |
| 7,906,813 B2 | 3/2011 | Kato | |
| 7,910,419 B2 | 3/2011 | Fenouillet-Beranger et al. | |
| 7,911,261 B1 * | 3/2011 | Shamarao | 327/535 |
| 7,919,791 B2 | 4/2011 | Flynn et al. | |
| 7,926,018 B2 | 4/2011 | Moroz et al. | |
| 7,935,984 B2 | 5/2011 | Nakano | |
| 7,941,776 B2 | 5/2011 | Majumder et al. | |
| 7,945,800 B2 | 5/2011 | Gomm et al. | |
| 7,948,008 B2 | 5/2011 | Liu et al. | |
| 7,952,147 B2 | 5/2011 | Ueno et al. | |
| 7,952,423 B2 | 5/2011 | Xiang et al. | |
| 7,960,232 B2 | 6/2011 | King et al. | |
| 7,960,238 B2 | 6/2011 | Kohli et al. | |
| 7,968,400 B2 | 6/2011 | Cai | |
| 7,968,411 B2 | 6/2011 | Williford | |
| 7,968,440 B2 | 6/2011 | Seebauer | |
| 7,968,459 B2 | 6/2011 | Bedell et al. | |
| 7,989,900 B2 | 8/2011 | Haensch et al. | |
| 7,994,573 B2 | 8/2011 | Pan | |
| 8,004,024 B2 | 8/2011 | Furukawa et al. | |
| 8,012,827 B2 | 9/2011 | Yu et al. | |
| 8,029,620 B2 | 10/2011 | Kim et al. | |
| 8,039,332 B2 | 10/2011 | Bernard et al. | |
| 8,046,598 B2 | 10/2011 | Lee | |
| 8,048,791 B2 | 11/2011 | Hargrove et al. | |
| 8,048,810 B2 | 11/2011 | Tsai et al. | |
| 8,051,340 B2 | 11/2011 | Cranford, Jr. et al. | |
| 8,053,340 B2 | 11/2011 | Colombeau et al. | |
| 8,063,466 B2 | 11/2011 | Kurita | |
| 8,067,279 B2 | 11/2011 | Sadra et al. | |
| 8,067,280 B2 | 11/2011 | Wang et al. | |
| 8,067,302 B2 | 11/2011 | Li | |
| 8,076,719 B2 | 12/2011 | Zeng et al. | |
| 8,097,529 B2 | 1/2012 | Krull et al. | |
| 8,103,983 B2 | 1/2012 | Agarwal et al. | |
| 8,105,891 B2 | 1/2012 | Yeh et al. | |
| 8,106,424 B2 | 1/2012 | Schruefer | |
| 8,106,481 B2 | 1/2012 | Rao | |
| 8,110,487 B2 | 2/2012 | Griebenow et al. | |
| 8,114,761 B2 | 2/2012 | Mandrekar et al. | |
| 8,119,482 B2 | 2/2012 | Bhalla et al. | |
| 8,120,069 B2 | 2/2012 | Hynecek | |
| 8,120,410 B2 | 2/2012 | Meijer et al. | |
| 8,129,246 B2 | 3/2012 | Babcock et al. | |
| 8,129,797 B2 | 3/2012 | Chen et al. | |
| 8,134,159 B2 | 3/2012 | Hokazono | |
| 8,138,786 B2 | 3/2012 | Lewis et al. | |
| 8,143,120 B2 | 3/2012 | Kerr et al. | |
| 8,143,124 B2 | 3/2012 | Challa et al. | |
| 8,143,678 B2 | 3/2012 | Kim et al. | |
| 8,148,774 B2 | 4/2012 | Mori et al. | |
| 8,163,619 B2 | 4/2012 | Yang et al. | |
| 8,169,002 B2 | 5/2012 | Chang et al. | |
| 8,170,857 B2 | 5/2012 | Joshi et al. | |
| 8,173,499 B2 | 5/2012 | Chung et al. | |
| 8,173,502 B2 | 5/2012 | Yan et al. | |
| 8,176,461 B1 | 5/2012 | Trimberger | |
| 8,178,430 B2 | 5/2012 | Kim et al. | |
| 8,179,530 B2 | 5/2012 | Levy et al. | |
| 8,183,096 B2 | 5/2012 | Wirbeleit | |
| 8,183,107 B2 | 5/2012 | Mathur et al. | |
| 8,185,865 B2 | 5/2012 | Gupta et al. | |
| 8,187,959 B2 | 5/2012 | Pawlak et al. | |
| 8,188,542 B2 | 5/2012 | Yoo et al. | |
| 8,196,545 B2 | 6/2012 | Kurosawa | |
| 8,201,122 B2 | 6/2012 | Dewey, III et al. | |
| 8,214,190 B2 | 7/2012 | Joshi et al. | |
| 8,217,423 B2 | 7/2012 | Liu et al. | |
| 8,217,712 B2 * | 7/2012 | Miyatake et al. | 327/537 |
| 8,225,255 B2 | 7/2012 | Ouyang et al. | |
| 8,227,307 B2 | 7/2012 | Chen et al. | |
| 8,228,115 B1 | 7/2012 | Cullen | |
| 8,236,661 B2 | 8/2012 | Dennard et al. | |
| 8,239,803 B2 | 8/2012 | Kobayashi | |
| 8,247,300 B2 | 8/2012 | Babcock et al. | |
| 8,255,843 B2 | 8/2012 | Chen et al. | |
| 8,258,026 B2 | 9/2012 | Bulucea | |
| 8,266,567 B2 | 9/2012 | El Yahyaoui et al. | |
| 8,286,180 B2 | 10/2012 | Foo | |
| 8,288,798 B2 | 10/2012 | Passlack | |
| 8,299,562 B2 | 10/2012 | Li et al. | |
| 8,324,059 B2 | 12/2012 | Guo et al. | |
| 8,493,133 B2 * | 7/2013 | Byeon | 327/536 |
| 8,508,287 B2 * | 8/2013 | Kern et al. | 327/536 |
| 8,659,346 B2 * | 2/2014 | Ogawa | 327/535 |
| 2001/0014495 A1 | 8/2001 | Yu | |
| 2002/0042184 A1 | 4/2002 | Nandakumar et al. | |
| 2003/0006415 A1 | 1/2003 | Yokogawa et al. | |
| 2003/0047763 A1 | 3/2003 | Hieda et al. | |
| 2003/0122203 A1 | 7/2003 | Nishinohara et al. | |
| 2003/0173626 A1 | 9/2003 | Burr | |
| 2003/0183856 A1 | 10/2003 | Wieczorek et al. | |
| 2003/0215992 A1 | 11/2003 | Sohn et al. | |
| 2004/0075118 A1 | 4/2004 | Heinemann et al. | |
| 2004/0075143 A1 | 4/2004 | Bae et al. | |
| 2004/0084731 A1 | 5/2004 | Matsuda et al. | |
| 2004/0087090 A1 | 5/2004 | Grudowski et al. | |
| 2004/0126947 A1 | 7/2004 | Sohn | |
| 2004/0175893 A1 | 9/2004 | Vatus et al. | |
| 2004/0180488 A1 | 9/2004 | Lee | |
| 2005/0052219 A1 * | 3/2005 | Butler et al. | 327/534 |
| 2005/0106824 A1 | 5/2005 | Alberto et al. | |
| 2005/0116282 A1 | 6/2005 | Pattanayak et al. | |
| 2005/0250289 A1 | 11/2005 | Babcock et al. | |
| 2005/0280075 A1 | 12/2005 | Ema et al. | |
| 2006/0022270 A1 | 2/2006 | Boyd et al. | |
| 2006/0049464 A1 | 3/2006 | Rao | |
| 2006/0068555 A1 | 3/2006 | Zhu | |
| 2006/0068586 A1 | 3/2006 | Pain | |
| 2006/0071278 A1 | 4/2006 | Takao | |
| 2006/0132187 A1 | 6/2006 | Tschanz et al. | |
| 2006/0154428 A1 | 7/2006 | Dokumaci | |
| 2006/0197158 A1 | 9/2006 | Babcock et al. | |
| 2006/0203581 A1 | 9/2006 | Joshi et al. | |
| 2006/0220114 A1 | 10/2006 | Miyashita et al. | |
| 2006/0223248 A1 | 10/2006 | Venugopal et al. | |
| 2007/0040222 A1 | 2/2007 | Van Camp et al. | |
| 2007/0117326 A1 | 5/2007 | Tan et al. | |
| 2007/0158790 A1 | 7/2007 | Rao | |
| 2007/0212861 A1 | 9/2007 | Chidambarrao et al. | |
| 2007/0238253 A1 | 10/2007 | Tucker | |
| 2008/0067589 A1 | 3/2008 | Ito et al. | |
| 2008/0108208 A1 | 5/2008 | Arevalo et al. | |
| 2008/0169493 A1 | 7/2008 | Lee et al. | |
| 2008/0169516 A1 | 7/2008 | Chung | |
| 2008/0197439 A1 | 8/2008 | Goerlach et al. | |
| 2008/0227250 A1 | 9/2008 | Ranade et al. | |
| 2008/0237661 A1 | 10/2008 | Ranade et al. | |
| 2008/0258198 A1 | 10/2008 | Bojarczuk et al. | |
| 2008/0272409 A1 | 11/2008 | Sonkusale et al. | |
| 2009/0057746 A1 | 3/2009 | Sugll et al. | |
| 2009/0108350 A1 | 4/2009 | Cai et al. | |
| 2009/0134468 A1 | 5/2009 | Tsuchiya et al. | |
| 2009/0224319 A1 | 9/2009 | Kohli | |
| 2009/0302388 A1 | 12/2009 | Cai et al. | |
| 2009/0309140 A1 | 12/2009 | Khamankar et al. | |

(56) References Cited

U.S. PATENT DOCUMENTS

| | | |
|---|---|---|
| 2009/0311837 A1 | 12/2009 | Kapoor |
| 2009/0321849 A1 | 12/2009 | Miyamura et al. |
| 2010/0002473 A1 | 1/2010 | Williams |
| 2010/0012988 A1 | 1/2010 | Yang et al. |
| 2010/0038724 A1 | 2/2010 | Anderson et al. |
| 2010/0100856 A1 | 4/2010 | Mittal |
| 2010/0148153 A1 | 6/2010 | Hudait et al. |
| 2010/0149854 A1 | 6/2010 | Vora |
| 2010/0187641 A1 | 7/2010 | Zhu et al. |
| 2010/0207182 A1 | 8/2010 | Paschal |
| 2010/0270600 A1 | 10/2010 | Inukai et al. |
| 2011/0059588 A1 | 3/2011 | Kang |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |
| 2011/0095811 A1 | 4/2011 | Chi et al. |
| 2011/0147828 A1 | 6/2011 | Murthy et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2011/0212590 A1 | 9/2011 | Wu et al. |
| 2011/0230039 A1 | 9/2011 | Mowry et al. |
| 2011/0242921 A1 | 10/2011 | Tran et al. |
| 2011/0248352 A1 | 10/2011 | Shifren et al. |
| 2011/0294278 A1 | 12/2011 | Eguchi et al. |
| 2011/0309447 A1 | 12/2011 | Arghavani et al. |
| 2012/0021594 A1 | 1/2012 | Gurtej et al. |
| 2012/0034745 A1 | 2/2012 | Colombeau et al. |
| 2012/0056275 A1 | 3/2012 | Cai et al. |
| 2012/0065920 A1 | 3/2012 | Nagumo et al. |
| 2012/0086499 A1 | 4/2012 | Husain et al. |
| 2012/0108050 A1 | 5/2012 | Chen et al. |
| 2012/0132998 A1 | 5/2012 | Kwon et al. |
| 2012/0138953 A1 | 6/2012 | Cai et al. |
| 2012/0146155 A1 | 6/2012 | Hoentschel et al. |
| 2012/0167025 A1 | 6/2012 | Gillespie et al. |
| 2012/0187491 A1 | 7/2012 | Zhu et al. |
| 2012/0190177 A1 | 7/2012 | Kim et al. |
| 2012/0223363 A1 | 9/2012 | Kronholz et al. |

FOREIGN PATENT DOCUMENTS

| | | | |
|---|---|---|---|
| EP | 0531621 A2 | 3/1993 | |
| EP | 0683515 A1 | 11/1995 | |
| EP | 0714099 A1 | 5/1996 | |
| EP | 0889502 A2 | 1/1999 | |
| EP | 1450394 A1 | 8/2004 | |
| JP | 59193066 * | 1/1984 | ............ H01L 29/78 |
| JP | 04186774 * | 3/1992 | ............ H01L 29/784 |
| JP | 08288508 * | 1/1996 | ............ H01L 29/78 |
| JP | 08153873 * | 11/1996 | ............ H01L 29/78 |
| JP | 2004087671 * | 3/2004 | ............ H01L 29/78 |
| KR | 10-0794094 B1 | 7/2003 | |
| WO | 2007096913 A1 | 8/2007 | |
| WO | 2010052607 A1 | 5/2010 | |
| WO | 2011062788 A1 * | 5/2011 | ......... H01L 21/8238 |

OTHER PUBLICATIONS

Werner, P et al., "Carbon Diffusion in Silicon", Oct. 1998, Applied Physics Letters, vol. 73, No. 17, pp. 2465-2467.

Yan, Ran-Hong et al., "Scaling the Si MOSFET: From Bulk to SOI to Bulk", Jul. 1992, IEEE Transactions on Electron Devices, vol. 39, No. 7, pp. 1704-1710.

Chan et al., "DDRO: A Novel Performance Monitoring Methodology Based on Design-Dependent Ring Oscillators", IEEE International Symposium on Quality Electronic Design, Mar. 9, 2012.

Chen et al., "Fully On-Chip Temperature, Process, and Voltage Sensors", IEEE International Symposium on Circuits and Systems, 2010.

Datta et al., "A 45.6u2 13.4uW 7.1V/V Resolution Sub-Threshold Based Digital Process-Sensing Circuit in 45nm CMOS", GLSVLSI '11, Lausanne, Switzerland, May 2, 2011 to May 4, 2011.

Ghosh et al., "On-Chip Negative Bias Temperature Instability Sensor Using Slew Rate Monitoring Circuitry", IEEE International Symposium on Circuits and Systems, May 24, 2009 to May 27, 2009.

Ghosh et al., "On-Chip Process Variation Detection and Compensation for Parametric Yield Enhancement in sub-100nm CMOS Technology", IEEE International Symposium on Circuits and Systems, IBM Austin Center for Advanced Studies, 2007.

Nan et al., "Dynamic Voltage and Frequency Scaling for Power-Constrained Design using Process Voltage and Temperature Sensor Circuits", Journal of Information Processing Systems, vol. 7, No. 1, Mar. 2011.

Saxena et al., "Variation in Transistor Performance and Leakage in Nanometer-Scale Technologies", IEEE Transactions on Electron Devices, vol. 55, No. 1, Jan. 2008.

Tschanz et al., "Adaptive Body Bias for Reducing Impacts of Die-to-Die and Within-Die Parameter Variations on Microprocessor Frequency and Leakage", IEEE Journal of Solid-State Circuits, vol. 37, No. 11, Nov. 2002.

Zhang et al., "An On-Chip Characterizing System for Within-Die Delay Variation Measurement of Individual Standard Cells in 65-nm CMOS", Design Automation Conference, Jan. 25, 2011 to Jan. 28, 2011.

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.

Samsudin, K et al., Integrating Intrinsic Parameter Fluctuation Description into BSIMSOI to Forecast sub-15 nm UTB SOI based 6T SRAM Operation, Solid-State Electronics (50), pp. 86-93, (2005).

Wong, H et al., "Nanoscale CMOS", Proceedings of the IEEE, Vo. 87, No. 4, pp. 537-570.

Machine Translation of KR 10-0794094 Submitted herewith.

Banerjee et al., "Compensating Non-Optical Effects using Electrically-Driven Optical Proximity Correction", Proc. of SPIE, vol. 7275, 2009.

Cheng et al., "Extremely Thin SOI (ETSOI) CMOS with Record Low Variability for Low Power System-on-Chip Applications", IEDM 2009, Dec. 2009.

Cheng et al., "Fully Depleted Extremely Thin SOI Technology Fabricated by a Novel Integration Scheme Featuring Implant-Free, Zero-Silicon-Loss, and Faceted Raised Source/Drain", 2009 Symposium on VLSI Technology Digest of Technical Papers, 2009.

Drennan et al., "Implications of Proximity Effects for Analog Design", Custom Integrated Circuits Conference, 2006, CICC '06, IEEE, Sep. 10-13, 2006, pp. 169-176.

Hook et al., "Lateral Ion Implant Straggle and Mask Proximity Effect", IEEE Transactions on Electron Devices, vol. 50, No. 9, Sep. 2003.

Hori et al., "A 0.1 um CMOS with a Step Channel Profile Formed by Ultra High Vacuum CVD and In-Situ Doped Ions", IEDM 1993, May 12, 1993.

Matsuhashi et al., "High-Performance Double-Layer Epitaxial-Channel PMOSFET Compatible with a Single Gate CMOSFET", 1996 Symposium on VLSI Technology Digest of Technical Papers, 1996.

Shao et al., "Boron diffusion in silicon: the anomalies and control by point defect engineering", Materials Science and Engineering R 42 (2003), Nov. 2003, pp. 65-114.

Sheu et al., "Modeling the Well-Edge Proximity Effect in Highly Scaled MOSFETs", IEEE Transactions on Electron Devices, vol. 53, No. 11, Nov. 2006, pp. 2792-2798.

* cited by examiner

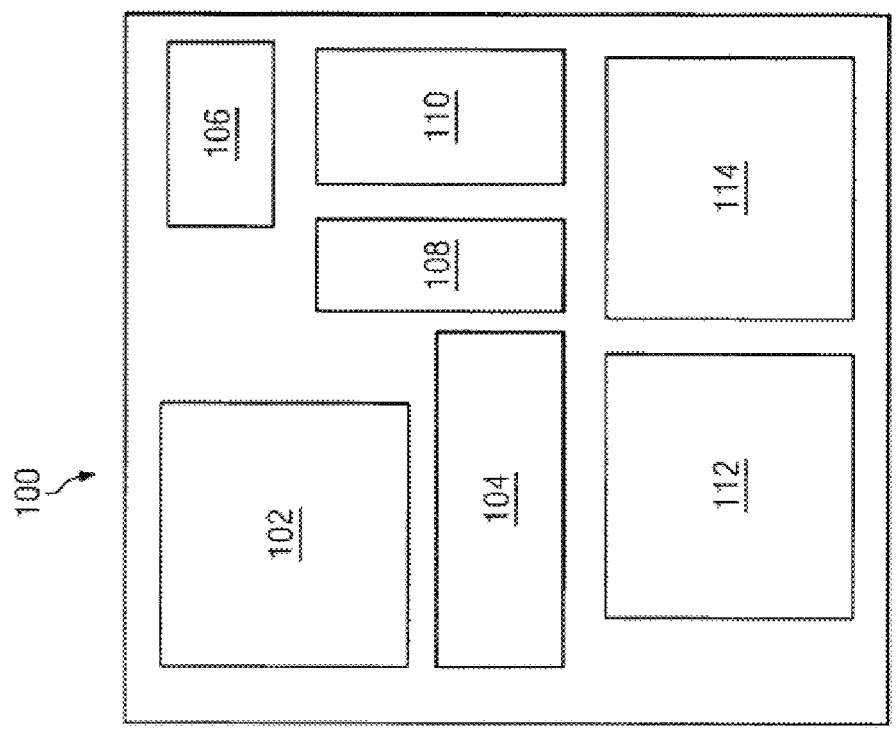

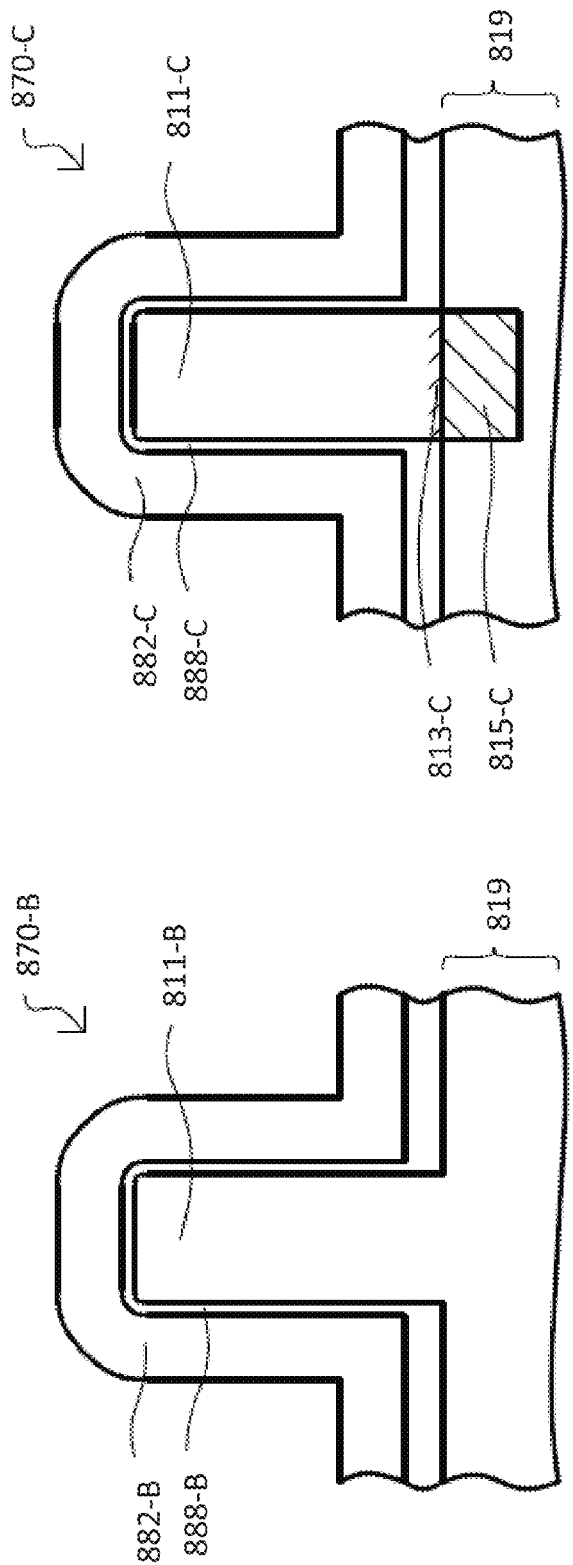

CIRCUITS AND DEVICES FOR GENERATING BI-DIRECTIONAL BODY BIAS VOLTAGES, AND METHODS THEREFOR

CROSS-REFERENCE TO RELATED APPLICATIONS

This application claims the benefit of U.S. Provisional Application Ser. No. 61/589,802, filed on Jan. 23, 2012, the contents of which are incorporated by reference herein, in their entirety.

TECHNICAL FIELD

The present invention relates generally to integrated circuit body biasing circuits and techniques, and more particularly to body biasing circuits that can bias transistors between reverse and forward body biases.

BACKGROUND

FIG. 1 shows a block diagram of a system-on-chip (SoC) 100. An SoC can include different device types, such as various combinations of digital and/or analog transistors that have distinct performance requirements, and can include differing structures, voltages, and/or interconnect conditions for operation. SoCs are advantageous in that the on-chip integration of a multiplicity of functional blocks offer smaller size, improved performance, and lower power than systems that use multiple integrated circuits that are separately packaged and electrically connected together by motherboard, stack package, or through silicon via interconnects.

As seen in FIG. 1, a variety of different designs can exist on a single SoC 100. The SoC 100 may include conventional digital logic 104, analog 108, input 102 and output 106, SRAM 112 and 114, and possibly other functional blocks 110, each of which may be interconnected to each other within the die via a common bus, wire traces, or other suitable interconnections. The device types supporting each of the functional blocks and designs can differ, for example, in size, operating voltage, switching speed, threshold voltage, applied body bias, source and drain dopant implants, gate stack dielectric materials, gate metals, or digital or analog operation. The devices are preferably formed or otherwise processed as bulk complementary metal-oxide-semiconductor (CMOS) on a common substrate (as opposed to silicon-on-insulator), typically silicon or other similar substrate. SoCs are often used in computing devices, embedded control systems, integrated wireless controllers, cell phones, network routers or wireless points, sensors, mechanical or electrical controllers, or the like.

An SoC 100 can have various performance requirements. For example, it is desirable for an SoC 100 to operate at high speeds. At the same time, it is desirable for an SoC 100 to be power efficient. Lowering a power supply voltage of an SoC 100 can be an effective way to reduce both switching and leakage power in very large scale integration (VLSI) circuits of an SoC 100. However, at the device level, it can be necessary to reduce the threshold voltage of transistors in conjunction with lowering the power supply voltage in order to satisfy target speed requirements of the SoC. The resulting reduction of threshold voltages can contribute to an exponential increase of sub-threshold leakage currents for the SoC. Thus, increased leakage power can become a significant factor for the SoC as the technology is being scaled.

In addition, on-chip process variations in advanced technologies can cause large variations in threshold voltages of transistors thereby further degrading the performance of SoCs.

BRIEF DESCRIPTION OF THE DRAWINGS

FIG. 1 is a block diagram of a system-on-chip (SoC) device.

FIGS. 8A to 8C shows transistors that can be included in embodiments.

DETAILED DESCRIPTION

Various embodiments of the present invention will now be described in detail with reference to a number of drawings. The embodiments show circuits, devices and methods that can drive substrates between forward and reverse body bias voltages for transistors formed within such substrates. Such body biasing control can be applied to different device and/or circuit types to optimize performance. Such body biasing can also be varied according to mode of operation for dynamic body biasing between reverse and forward body biases in response to modes or operating conditions.

In order to accommodate process variations and/or performance requirements, body bias circuits can be used as part of power management techniques (e.g., system-on-chip (SoC) integrated circuits). According to embodiments, a forward body bias (FBB) can be applied to slow transistors to improve their speed and satisfy specified speed targets, and a reverse body bias (RBB) can be applied to fast but leaky transistors, to reduce leakage currents. Furthermore, large reverse body bias can also be applied during standby modes to significantly reduce leakage current.

A device can specify different body bias voltages for different modules or parts of the device to accommodate differing speed and/or power requirements or targets. Embodiments in this disclosure can include one or more a body bias circuits in a device (e.g., SoC) that can provide both forward body bias and reverse body bias voltages. Such flexible body biasing can be used to compensate for variations of threshold voltages of transistors in the device. Still further, body bias circuits according to embodiments herein can generate different body bias voltages in different modes of operation (e.g., different body bias voltages can be employed for normal operating mode as compared to a standby mode).

Embodiments of body bias generator circuits as described herein can be programmed to generate a bi-directional body bias voltage (i.e., a body bias voltage that varies between a reverse body bias and a forward body bias). In particular embodiments, a maximum forward body bias and maximum reverse body bias can be independently controlled.

According to embodiments, body bias generator circuits can be programmed during the operation of a device (e.g., SoC) to adaptively change the body bias voltages during operation to satisfy specified speed and/or power targets at different operating conditions, to change the body bias voltage to satisfy speed and power targets for different modes of operation, or combinations thereof. Such adaptive, bi-directional body bias generator circuits can be advantageous when included in low power SoC applications, such as mobile processors.

Figure 2A:
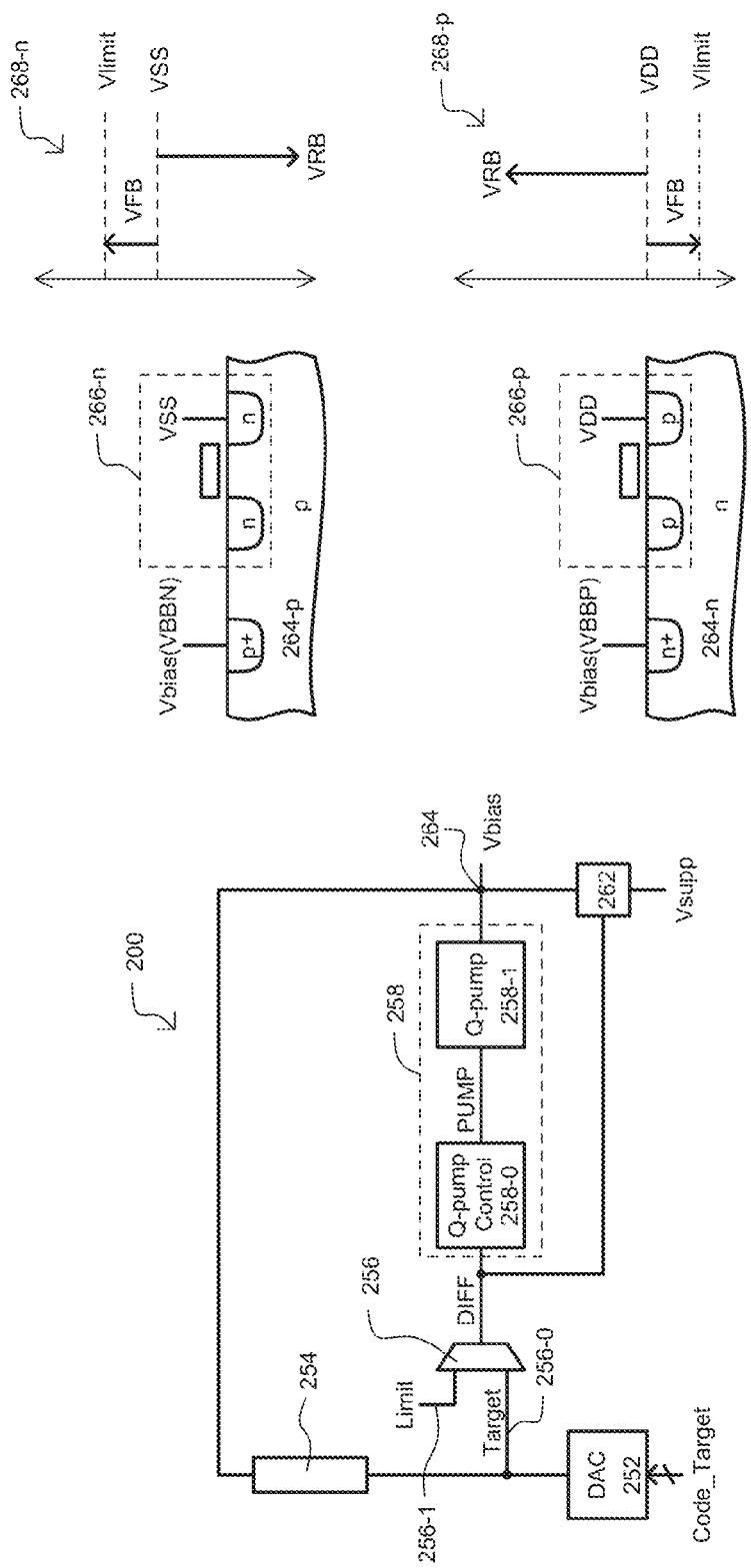
FIG. 2A is a diagram showing a bi-directional body bias circuit according to an embodiment.

FIG. 2A is a block diagram of a bi-directional body bias circuit 200 according to one embodiment, as well as examples of body biases for different transistor types. Bias circuit 200 can include a control digital-to-analog converter (DAC) 252, a control load 254, a detect circuit 256, and a charge pump circuit 258 connected to a substrate portion 264.

A control DAC 252 can establish a target value (Target) at a first input node 256-0 of detect circuit 256 in response to a digital target code (Code_Target). In some embodiments, a control DAC 252 can be a voltage DAC that establishes a voltage at first input node 256-0. In other embodiments, a control DAC 252 can be a current DAC 252 that establishes a voltage at first input node 256-0 by setting a current drawn through control load 254. In still other embodiments, a control DAC 252 (optionally in combination with control load 254) can establish a current flow input to first input node 256-0. A control load 254 can be a passive load, active load, or combination thereof. A control load 254 can be connected between substrate portion 264 and a first input node 256-0.

A detect circuit 256 can compare an input at first input node 256-0 to a limit value (Limit) at second input node 256-1 to generate a difference value DIFF. In some embodiments, values received at input nodes 256-0/1 can be voltages, currents, or combinations thereof. A Limit value can correspond to a maximum forward bias voltage applied at a substrate portion 264. In some embodiments a Limit value is programmable. A Target value is related to a desired voltage at substrate portion 264 through control load 254. A difference value DIFF can correspond to a difference between a Limit value and a Target value.

A charge pump circuit 258 can pump a substrate portion 264 between a forward body bias voltage (FB) and a reverse body bias voltage (RB) for transistors in the substrate portion 264. In the embodiment shown, a charge pump circuit 258 can include a charge pump controller 258-0 and a charge pump 258-1. A charge pump controller 258-0 can generate pump control signals PUMP that vary according to difference value DIFF. A charge pump 258-1 can drive a substrate portion 264 in response to pump control signals PUMP.

A support circuit 262 can assist in driving substrate portion 264 toward a forward body bias direction. Accordingly, in response to difference value DIFF (or range of difference values), a support circuit 262 can drive a substrate portion 264 toward a supply voltage Vsupp.

In operation, a bias circuit 200 can receive a code value (Code_Target) corresponding to a desired voltage at substrate portion 264. In response to Code_Target, control DAC 252 can establish a Target value at a first input node 256-0. In response to a difference between value Target and Limit, detect circuit 256 can generate a difference value DIFF. According to difference value, charge pump circuit 258 can drive substrate portion 264 to establish a desired substrate voltage. It is understood that such a substrate voltage can range between a reverse body bias voltage and a forward body bias voltage.

FIG. 2A also shows two examples of transistors 266-n/p and corresponding possible body bias voltage ranges 268-p/n. Transistor 266-n is an n-channel transistor formed in a p-type substrate portion 264-p. During operation, a transistor 266-n can receive a lowest voltage at its source. In the embodiment shown, such a lowest voltage can be a low supply voltage (VSS). As shown by voltage range 268-n, a reverse body bias voltage VRB for transistor 266-n can be less than VSS. A forward body bias voltage VFB can be greater than VSS, but less than a limit (Vlimit).

Transistor 266-p is a p-channel transistor formed in an n-type substrate portion 264-n. During operations, a transistor 266-p can receive a highest voltage at its source. In the embodiment shown, such a highest voltage can be a high supply voltage (VDD). As shown by voltage range 268-p, a reverse body bias voltage VRB for transistor 266-p can be greater than VDD. A forward body bias voltage VFB can be less than VDD, but greater than a limit Vlimit.

As understood from above, a voltage Vlimit can be established by a Limit value, while a body bias voltage, which can range from VFB to VRB, can be established by a value Code_Target. It is also understood that transistors 266-n/p can take any of various forms, as will be described for embodiments below.

Figure 2B:
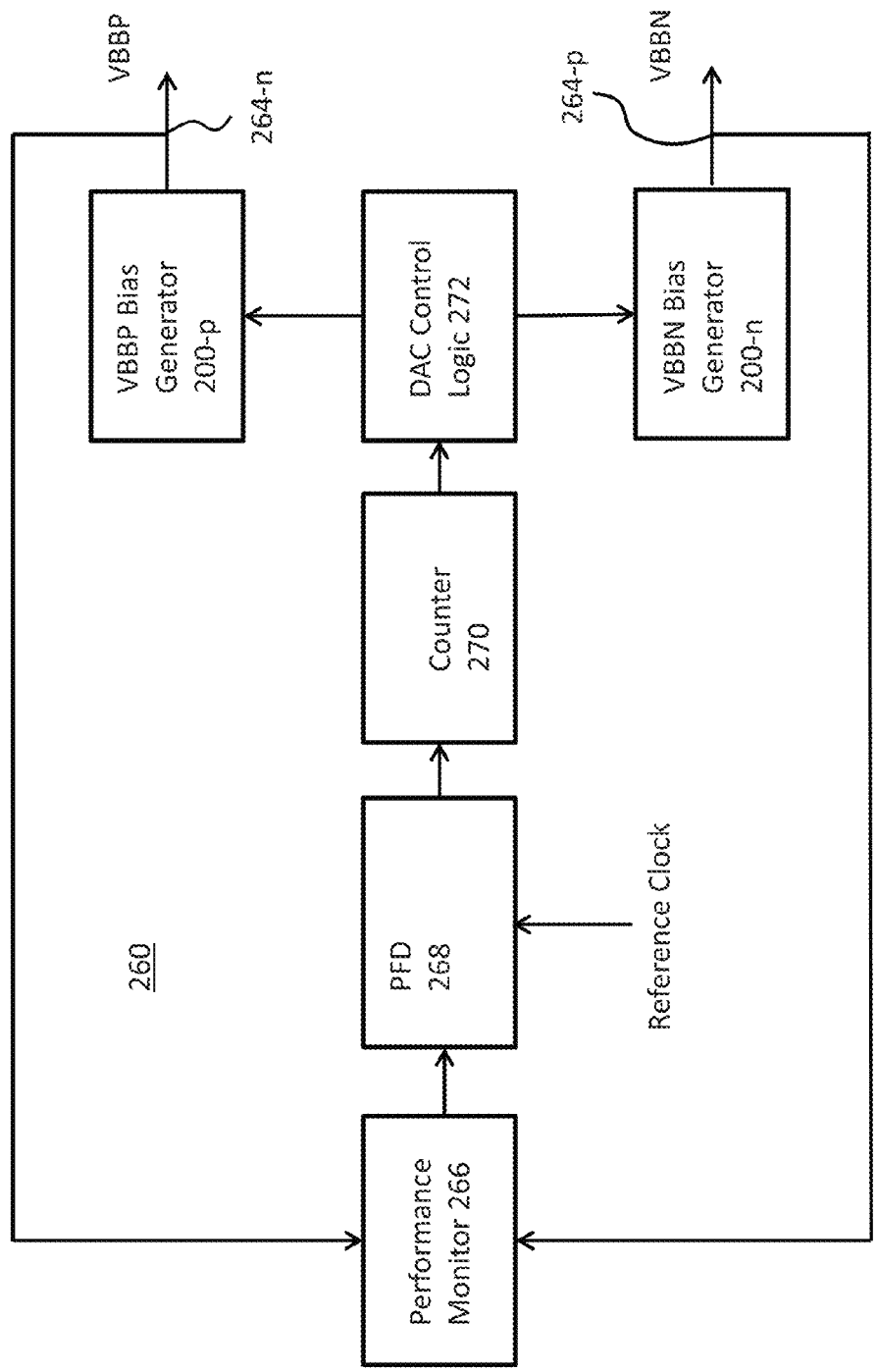
FIG. 2B is a diagram showing an adjustable body bias circuit according to an embodiment.

FIG. 2B is a block diagram of an adaptive body bias (ABB) circuit 260, in accordance with one embodiment. The ABB circuit 260 can be used to dynamically change the body bias voltage applied to the different transistors of an integrated circuit device. In a very particular embodiment, an ABB circuit 260 can establish body bias voltage for n-channel metal-oxide-semiconductor type (NMOS) transistors and p-channel MOS type (PMOS) transistors in one or more different modules of an SoC device to achieve target speed and leakage objectives. In addition or alternatively, the ABB circuit 260 can establish the body bias voltage(s) during the operation of a device (e.g., SoC).

An ABB circuit 260 can include a performance monitor 266 that receives current bias voltages for different substrate portions of an integrated circuit device. In the embodiment shown, performance monitor 266 circuit can receive current NMOS and PMOS body bias voltages, VBBN and VBBP, respectively. Performance monitor 266 can generate a performance metric that is the measure of the current performance of the different substrate portions (e.g., SoC modules) of an integrated circuit device.

In particular embodiments, the performance monitor 266 can include one or more ring oscillator circuits that generate an oscillating signal, where the frequency of the oscillating signal represents a performance of substrate portions. A phase frequency detector (PFD) 268 can receive an output signal of the performance monitor 266. The PFD 268 can also receive one or more reference clocks (Reference Clock) that represents the target performance of devices in different substrate portions. In response to phase and/or frequency differences between signals from performance monitor 266 and reference clock(s), PFD 268 can generate one or more control signals. Counter 270 can receive control signals and generate one or more count values therefrom. The count value of counter 270 can be received by DAC control logic 272.

DAC control logic 272 can generate DAC values from count values, which can control the operation of one or more body bias circuits (e.g., 200-n/p). DAC values can be digital values corresponding to a target substrate voltage.

In the very particular embodiment shown, ABB circuit 260 can include a p-channel body bias circuit 200-p and an n-channel body bias circuit 200-n. A p-channel body bias circuit 200-p can generate a body bias voltage (VBBP) for PMOS devices formed in an n-type substrate portion 264-n. A body bias voltage (VBBP) can vary between a forward and reverse body bias voltage. Similarly, an n-channel body bias circuit 200-n can generate a body bias voltage (VBBN) for NMOS devices formed in a p-type substrate portion 264-p. A body bias voltage (VBBN) can vary between a forward and reverse body bias voltage.

Figure 3A:
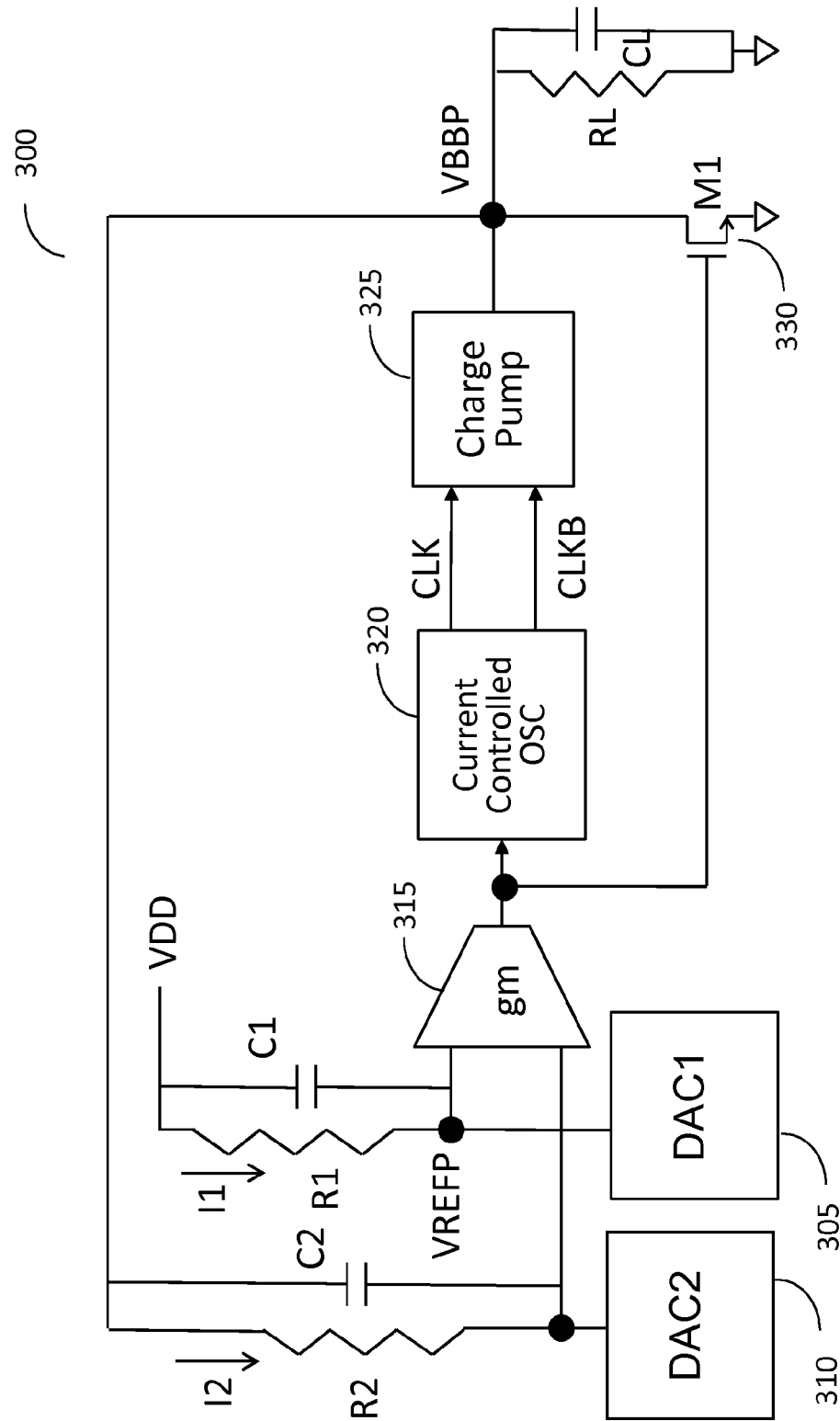
FIG. 3A is a diagram showing a bi-directional body bias circuit for p-channel transistors, according to an embodiment.

FIG. 3A shows a VBBP bias generator circuit 300 that generates forward and reverse body bias voltages for PMOS transistors, in accordance with one embodiment. The circuit 300 includes two current DACs, DAC1 305 and DAC2 310. DAC1 can determine a current I1 flowing through load R1/C1, and therefore determines the voltage VREFP that is received at a first input of the transconductance amplifier 315. DAC2 determines the current I2 flowing through load R2/C2. Thus, the voltage received at a second input of the transconductance amplifier 315 is determined by the PMOS body bias voltage VBBP and the current I2.

Transconductance amplifier 315 can compare the voltage received at the second input against VREFP to generate the control current for the current controlled oscillator 320 in a negative feedback loop.

Current controlled oscillator 320 can generate two complementary clock signals CLK and CLKB, whose frequency is determined by the control voltage. The clock signals CLK and CLKB can control a charge pump 325 that generates the PMOS bias voltage VBBP. The output voltage of the charge pump is settled to the target value through the negative feedback loop and the ripple of the output voltage is determined by the frequency of the clock signal CLK and CLKB. Transistor M1 330 is used to support current during forward body biasing. The resistor RL and capacitor CL represent a resistive and capacitive load connected to the output of the charge pump 325 (i.e., a substrate portion).

A circuit 300 can operate as follows. First, DAC1 305 can be used to set the maximum forward bias voltage. As but one very particular example, to generate a forward bias voltage of 300 mV with power supply voltage VDD=1.2V, a maximum DAC1 code can set current I1 such that the voltage drop across load R1/C1 is 300 mV, and therefore, VREFP=VDD−I1·R1=1.2 V−0.3 V=0.9 V. Second, DAC2 310 can be programmed to select the current I2 to develop the desired voltage across load R2/C2 so that the final output voltage VBBP=VREFP+I2·R2=VDD−I1·R1+I2·R2. If the maximum DAC2 code sets the current I2 such that the voltage drop across R2 (I2·R2) is 1 V, then VBBP=1.2 V−0.3 V+1 V=1.9 V. This corresponds to a 700 mV reverse body bias for PMOS transistors that can be set by the maximum DAC2 code. If the DAC2 code is at minimum, I2=0 thereby VBBP=VREFP=0.9 V. This is a 300 mV FBB (forward body bias).

The DAC2 310 can be programmed with intermediate codes between the maximum and minimum codes to generate PMOS bias voltages between the maximum reverse bias voltage (e.g., 700 mv) that is set by the maximum DAC2 code and load resistor R2/C2, and the maximum forward bias voltage 300 mV that is set by the maximum DAC1 code and resistor R1/C1. An advantageous feature of the circuit 300 is that the forward body bias and reverse body bias voltage levels can be controlled independently by programming DAC1 305 and DAC2 310. Therefore, the circuit 300 can be used to generate bi-directional (i.e., both forward and reverse) PMOS body bias voltages required in different sections of an integrated circuit device (e.g., modules or circuit blocks of an SoC).

Figure 3B:
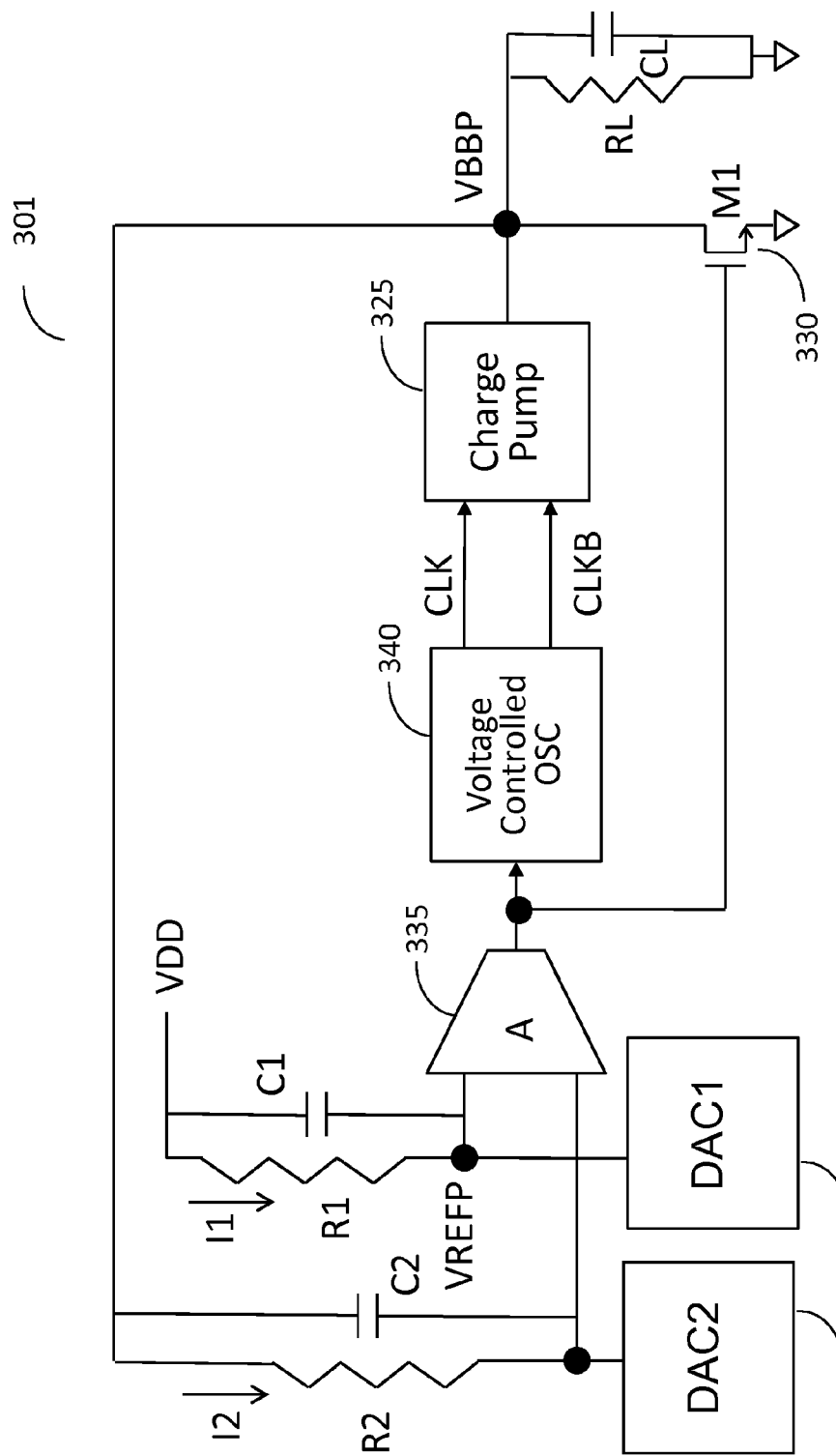
FIG. 3B is a diagram showing a bi-directional body bias circuit for p-channel transistors, according to another embodiment.

FIG. 3B shows an alternative embodiment of a VBBP bias generator circuit 301 that uses a voltage amplifier 335 and a voltage controlled oscillator 340. In circuit 301, the voltage amplifier 335 compares the voltage received at the second input against VREFP to generate the control voltage for the voltage controlled oscillator 340 in a negative feedback loop. The operation of circuit 301 is otherwise similar to that of circuit 300.

Figure 3C:
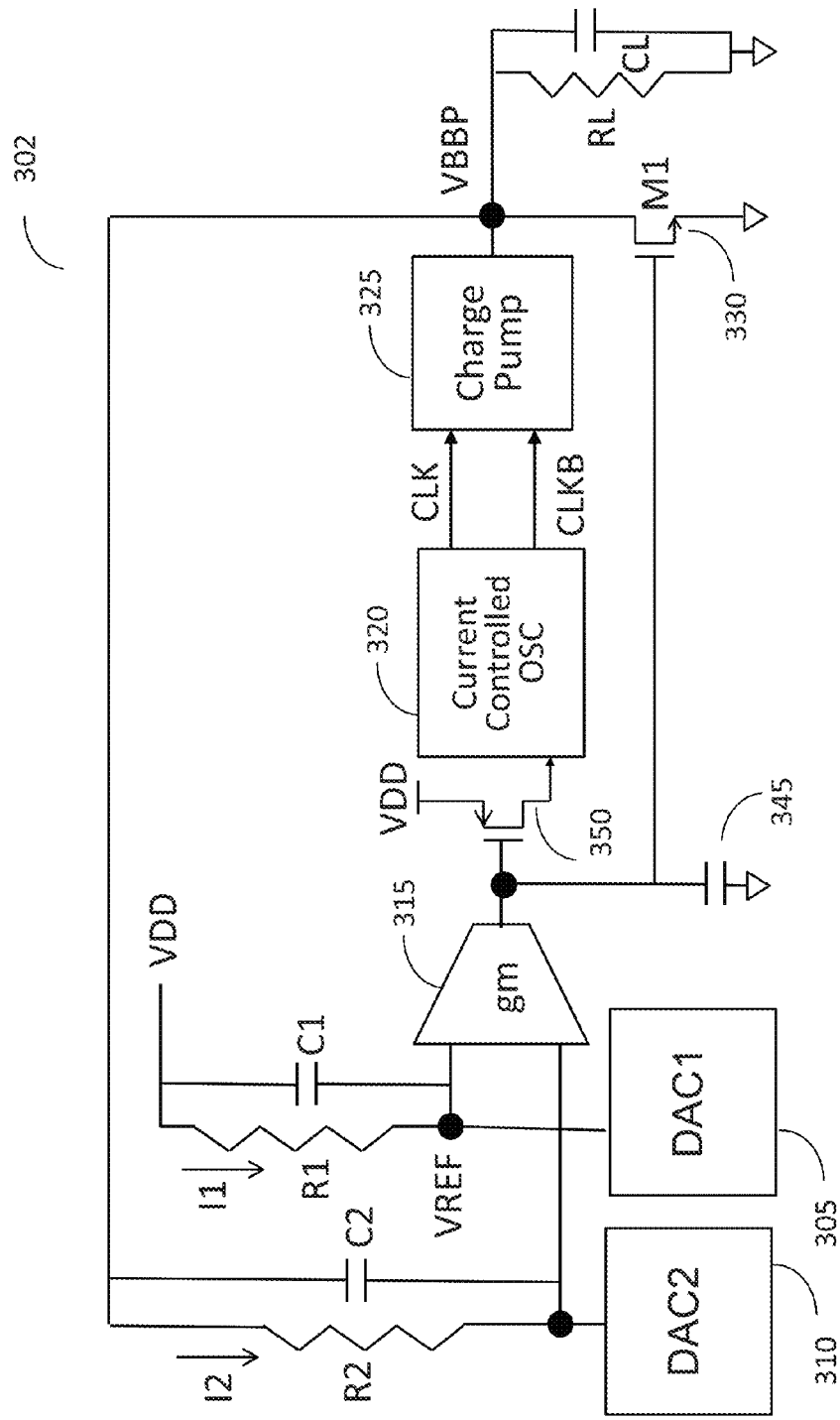
FIG. 3C is a diagram showing a bi-directional body bias circuit for p-channel transistors, according to a further embodiment.

FIG. 3C shows another embodiment 302 of a VBBP bias generator that uses a capacitor 345 and PMOS transistor 350 to generate the control current for the current controlled oscillator 320. In response to a voltage output from transconductance amplifier 315, PMOS transistor 350 can vary a current provided to current controlled oscillator 320. Further, if a voltage output from transconductance amplifier 315 is sufficiently high, transistor M1 can be turned on, to pull a body bias voltage VBBP toward a low supply voltage.

Figure 4A:
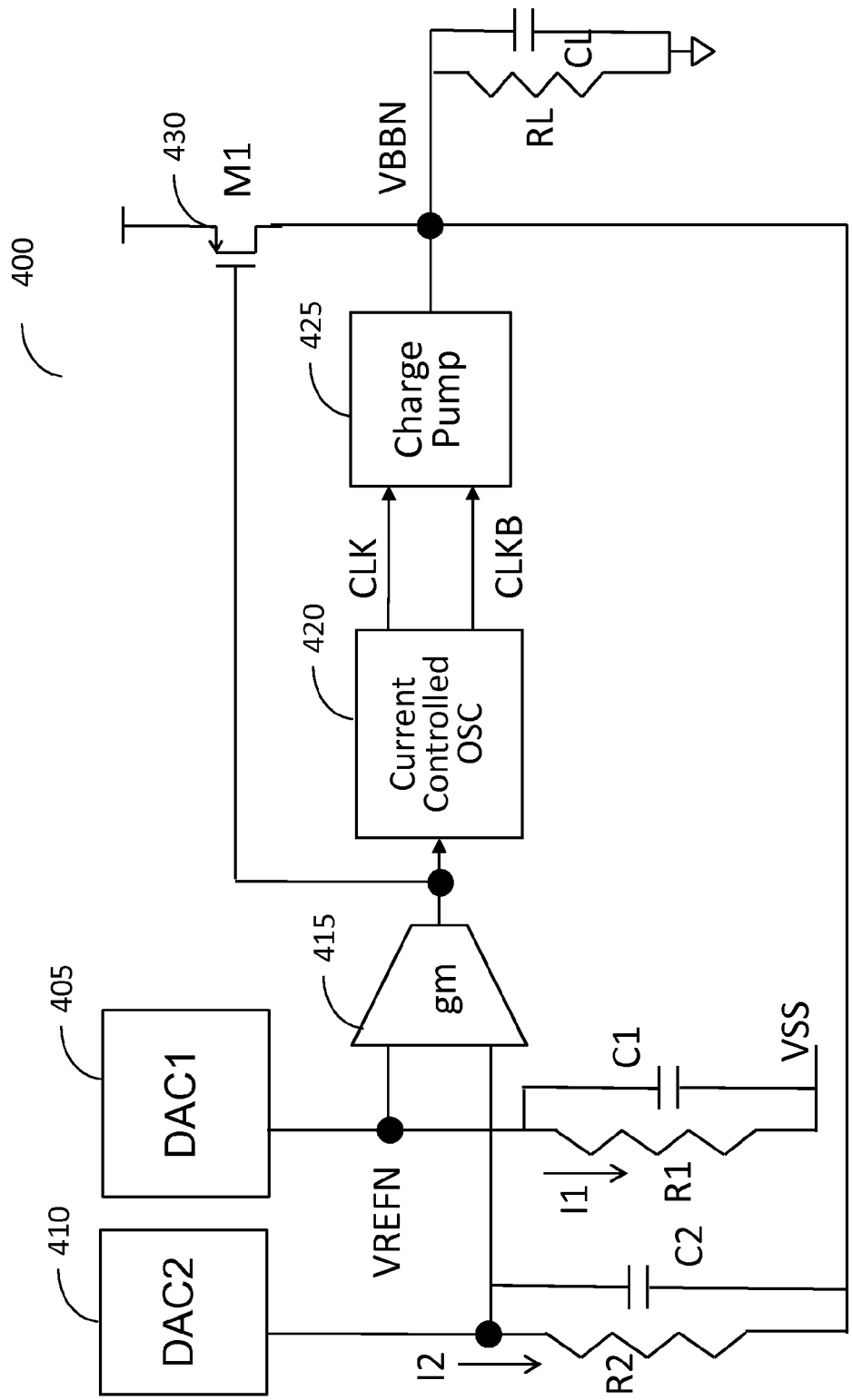
FIG. 4A is a diagram showing a bi-directional body bias circuit for n-channel transistors, according to an embodiment.

FIG. 4A shows a VBBN bias generator circuit 400 that generates forward and reverse body bias voltages for NMOS transistors, in accordance with one embodiment. Circuit 400 includes two current DACs, DAC1 405 and DAC2 410. DAC1 405 can determine a current I1 flowing through the load R1/C1, and therefore, determines the voltage VREFN that is received at a first input of the transconductance amplifier 415. DAC2 410 can determine the current I2 flowing through load R2/C2. Thus, the voltage received at a second input of the transconductance amplifier 415 can be determined by the NMOS body bias voltage VBBN and the current I2.

Transconductance amplifier 415 compares the voltage received at the second input against VREFN to generate the control current for the current controlled oscillator 420 in a negative feedback loop. The current controlled oscillator 420 generates two complementary clock signals CLK and CLKB, whose frequency is determined by the control current. The clock signals CLK and CLKB control a charge pump 425 that generates the NMOS bias voltage VBBN. The output voltage of the charge pump 425 is determined by the frequency of the clock signal CLK and CLKB. The transistor M1 430 can be used to support current during forward body biases. The resistor RL and capacitor CL represent a resistive and capacitive load connected to the output of the charge pump 425.

Circuit 400 can work as follows. First, DAC1 405 can be used to set the maximum forward bias voltage. In one very particular embodiment, to generate a maximum forward bias voltage of 300 mV with power supply voltage VDD=1.2 V, the maximum DAC1 code sets the current I1 such that the voltage drop across load R1/C1 is 300 mV, and therefore, VREFN=I1·R1+VSS=300 mV+0 V=300 mV. Second, DAC2 410 can be programmed to select the current I2 to develop the desired voltage across load R2/C2 so that the final output voltage VBBN=VREFN−I2·R2=300 mV−I2·R2. If the maximum DAC2 code sets the current I2 such that the voltage drop across R2/C2 (I2·R2) is 1 V, then VBBN=300 mV−1 V=−0.7 V. This corresponds to 700 mV reverse body bias for NMOS transistors that is set by the maximum DAC2 code. If the DAC2 code is at minimum, I2=0 thereby VBBN=VREFN=300 mV, which corresponds to a 300 mV forward body bias. The DAC2 410 can be programmed with intermediate codes between the maximum and minimum codes to generate NMOS bias voltages between the maximum reverse bias voltage 700 mv that is set by the maximum DAC2 code and resistor R2/C2, and the maximum forward bias voltage 300 mV that is set by the maximum DAC1 code and resistor R1/C1.

An advantageous feature of the circuit 400 is that forward body bias and reverse body bias voltage levels can be controlled independently by programming DAC1 405 and DAC2 410. Therefore, the circuit 400 can be used to generate bi-directional (i.e., both forward and reverse) body bias voltages for different sections of an integrated circuit device (e.g., different modules or circuit blocks in an SoC).

Figure 4B:
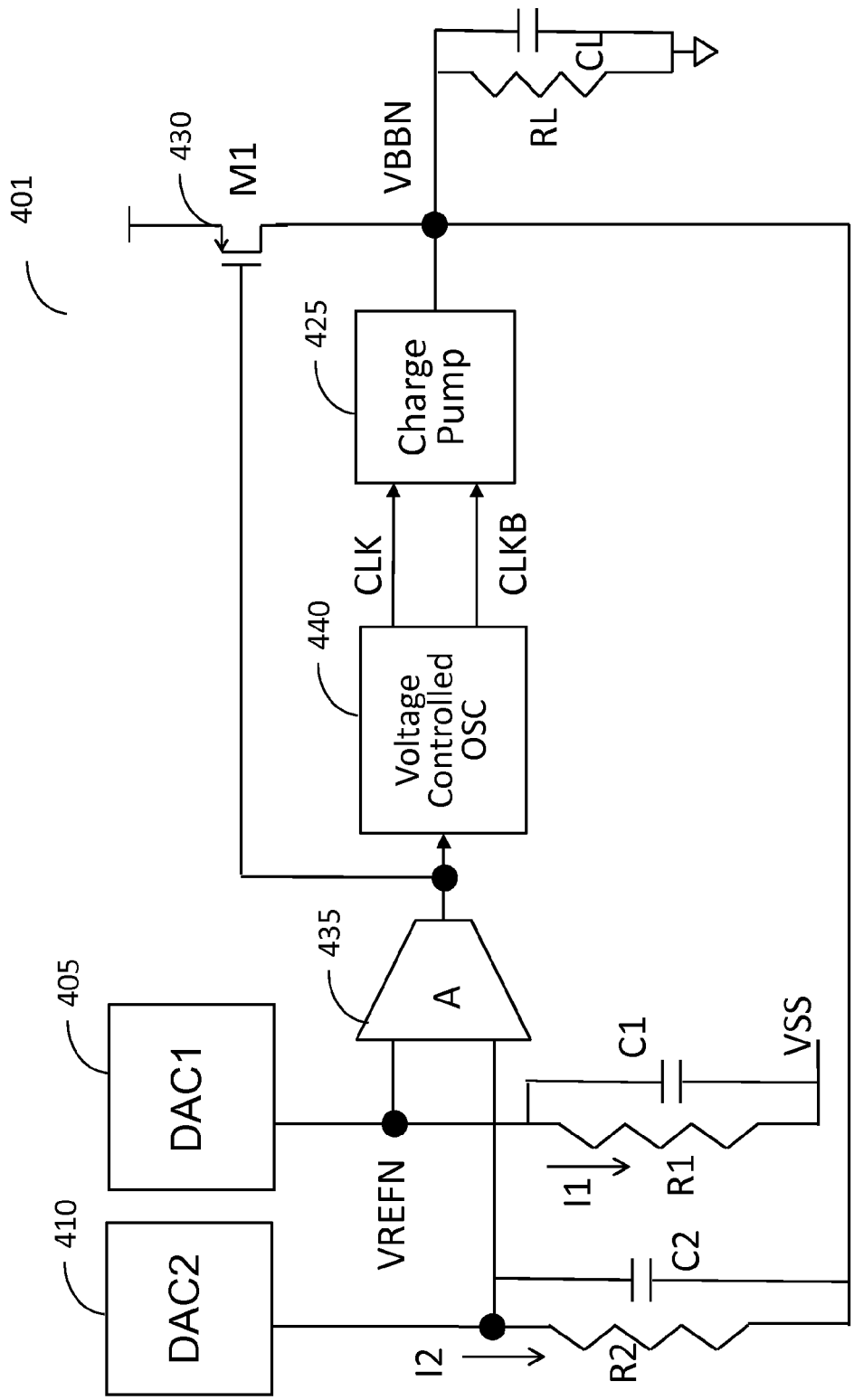
FIG. 4B is a diagram showing a bi-directional body bias circuit for n-channel transistors, according to another embodiment.

FIG. 4B shows an alternative embodiment of the VBBN bias generator circuit 401 that uses a voltage amplifier 435 and a voltage controlled oscillator 440. In circuit 401, the voltage amplifier 435 compares the voltage received at the second input against VREFN to generate the control voltage for the voltage controlled oscillator 440 in a negative feedback loop. The operation of circuit 401 is otherwise similar to that of circuit 400.

Figures 5A, 5B:
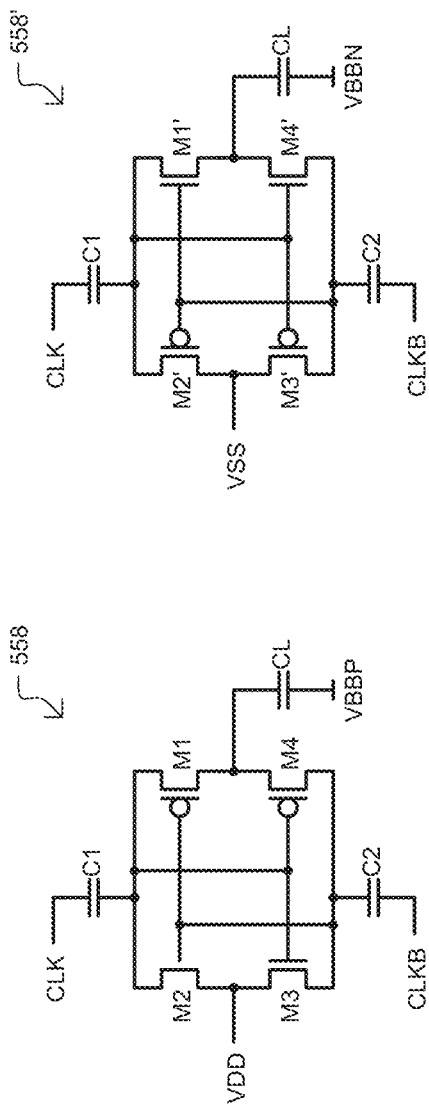
FIG. 5A shows a charge pump circuit for p-channel transistors that can be included in embodiments.
FIG. 5B shows a charge pump circuit for n-channel transistors that can be included in embodiments.

FIG. 5A shows a charge pump 558 that can be included in embodiments. Charge pump shown in FIG. 5 can produce a charging signal at both phases of CLK and CLKB. In one phase transistors M1 & M3 are on to charge (e.g., pump) the output voltage VBBP and at the other phase, M2 & M4 are on. Charge pump 558 can be used in the embodiments disclosed herein (e.g., VBBP and VBBN bias generator circuits identified as reference numerals 300 and 400 respectively) to generate the required bi-directional body bias voltage with minimum area and power overhead. For the VBBN case appropriate switching of power supplies is utilized (as shown in FIG. 5B).

In a particular embodiment, charge pump 558 can be formed with deeply depleted channel (DDC) transistors (described in more detail below).

Figure 6:
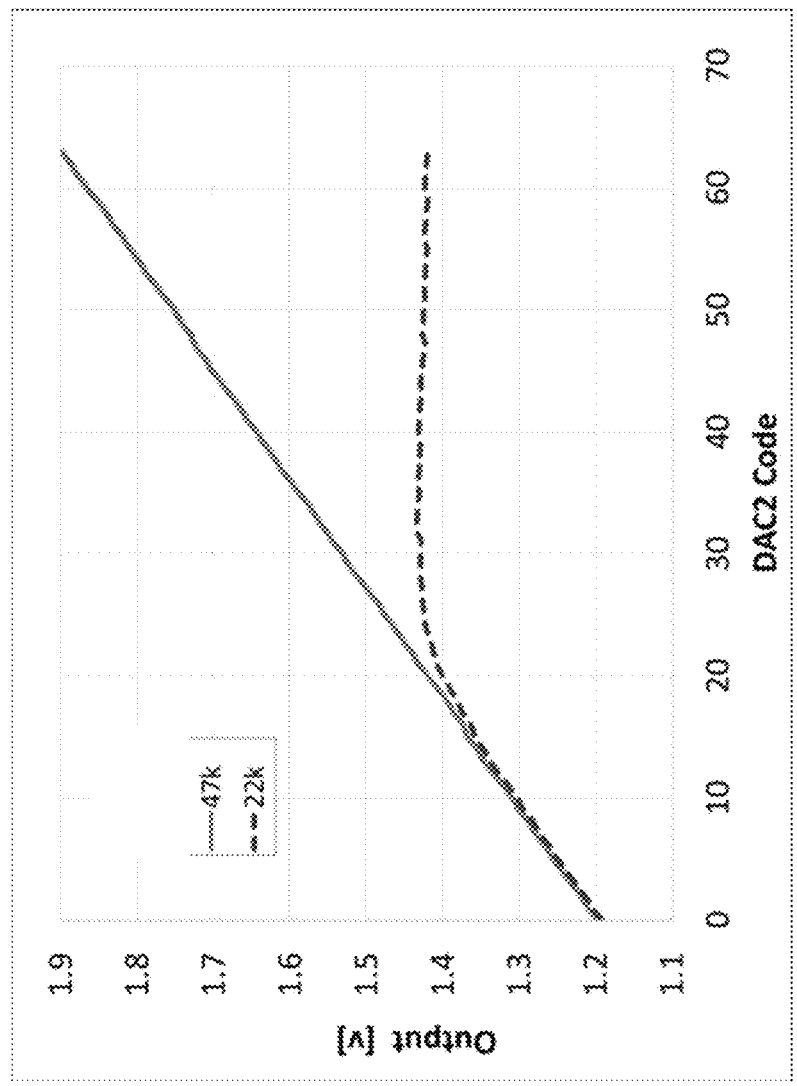
FIG. 6 is a graph showing output voltage levels according to digital-to-analog (DAC) codes for a bi-directional body bias circuit according to one very particular embodiment.

FIG. 6 shows a measured p-channel transistor body bias voltage (VBBP) versus a DAC2 code for a DAC (e.g., 310) as a function of load resistance (RL) for the circuit operating at VDD=1.2 V. In this case, a VBBP output voltage at a maximum DAC2 code is VDD+700 mV=1.9 V. Note that the voltage regulation is maintained until the load resistance equals 47 kΩ. This corresponds to about a 64 uA maximum driving capability of the VBBP generator at 1.4 V output, and at least 40 uA output current at 1.9 V output (with a 47 kΩ load). The design target for a circuit (e.g., FIG. 3A to 3C) is a maximum of 20 uA DC and 4 nF capacitive loads (CL). The 20 uA is two times the simulated total leakage current through the body and the capacitive load was calculated from simulations of 1 million NAND2 gates enclosed by a deep n-well structure. There is additional current margin to allow for corner variations, reduced drive at lower VDD, and transient charging of load capacitance.

Figure 7:
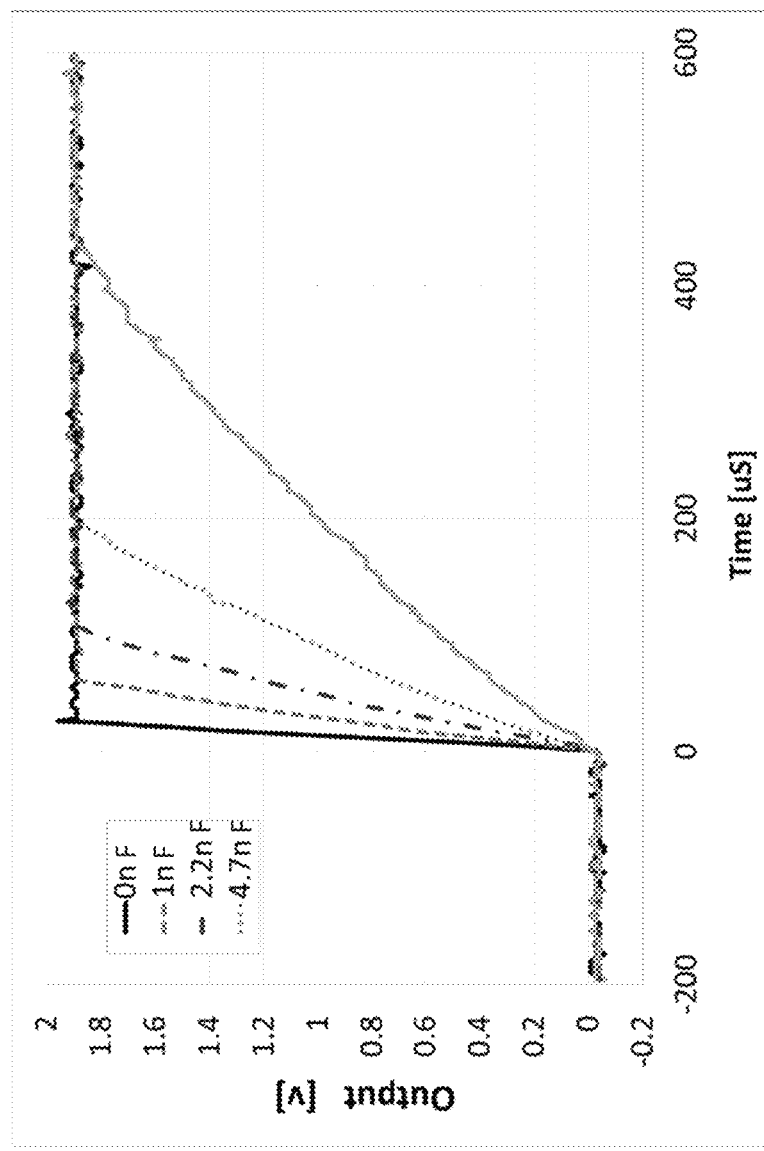
FIG. 7 is a graph showing transient responses for bi-directional body bias circuits according to very particular embodiments.

FIG. 7 shows a transient response of the VBBP generator (e.g., FIG. 3A to 3C) confirming loop stability with 100 kΩ load in parallel with different capacitive loads. These transient measurements indicate a maximum charging current of 55 μA near 1.9 V. The average slew rate is 10 mV/μsec during the 200 μsec pump-up period for 4.7 nF load. Simulations indicate a ripple voltage of less than 1 mV during regulation with a 4 nF load capacitance.

According to embodiments, low power devices, such as SoCs for mobile computing applications, can include bi-directional body bias circuits and/or ABB circuits for power management and/or yield improvement. The embodiments of the bidirectional bias circuits and/or ABB generator circuits described above can be implemented with minimal overhead in power and area, and therefore, can be particularly useful in SoC applications.

In very particular embodiments, bi-directional body bias circuits and/or ABB generator circuits, as disclosed herein or equivalents, can be implemented, all or in part, with DDC transistors. A DDC transistor have enhanced matching performance that can result in analog circuits implemented using DDC transistors having a smaller area than analog circuits implemented using non-DDC transistors. Therefore, the bidirectional ABB circuits can have a smaller area when implemented using analog transistors thereby reducing the overhead for including these circuits on the SoC. Embodiments of various structures and manufacturing processes suitable for use in DDC transistors are disclosed in U.S. Pat. No. 8,273,617, issued on Sep. 25, 2012, titled Electronic Devices and Systems, and Methods for Making and Using the Same, by Scott E. Thompson et al.; U.S. patent application Ser. No. 12/971,884, filed on Dec. 17, 2010 titled Low Power Semiconductor Transistor Structure and Method of Fabrication Thereof, now U.S. Pat. No. 8,530,286; U.S. patent application Ser. No. 12/971,955 filed on Dec. 17, 2010 titled Transistor with Threshold Voltage Set Notch and Method of Fabrication Thereof, published as U.S. Patent Publication No. 2011/0309447; and U.S. patent application Ser. No. 12/895,785 filed on Sep. 30, 2010 titled Advanced Transistors With Threshold Voltage Set Dopant Structures, published as U.S. Patent Publication No. 2011/0079861; the disclosures of which are hereby incorporated by reference in their entirety.

In addition or alternatively, body bias circuits and/or ABB generator circuits, as described herein or equivalents, can be included in integrated circuit devices to bias substrates of circuit sections that include DDC transistors. DDC transistors have an enhanced body coefficient as compared to non-DDC transistors, and therefore can be advantageously used in integrated circuit devices (e.g., SoCs) that include bi-directional adaptive body bias voltages to modify the threshold voltages and/or leakage currents of the DDC transistors. Various methods and structures for modifying the threshold voltage of DDC transistors are discussed in pending U.S. Provisional Patent Application Ser. No. 61/511,923 titled "Epitaxial Transistor Structure and Process for Advanced SOC", filed Jul. 26, 2011 and related U.S. patent application Ser. No. 13/459,971 filed on Apr. 30, 2012, now U.S. Pat. No. 8,629,016, and Ser. No. 13/624,449 filed on Sep. 21, 2012, now U.S. Pat. No. 8,653,604.

Figure 8A:
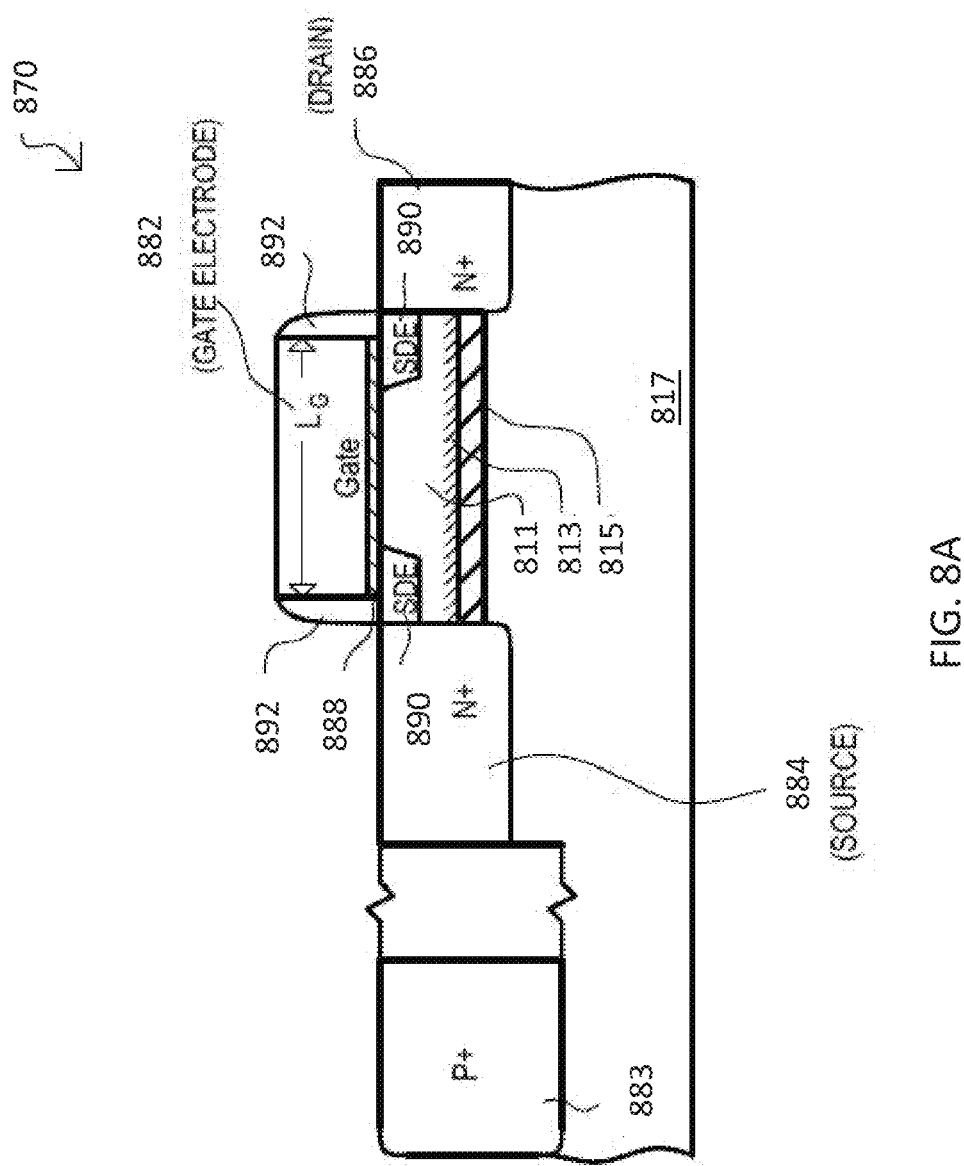

FIG. 8A shows a DDC type transistor 870, which can be included in embodiments. A DDC transistor 870 can be configured to have an enhanced body coefficient, along with the ability to set a threshold voltage (Vt) with enhanced precision. A DDC transistor 870 can include a gate electrode 882, source 884, drain 886, and a gate dielectric 888 positioned over a substantially undoped channel 811. Optional lightly doped source and drain extensions (SDE) 890 can be positioned respectively adjacent to source 884 and drain 886. Such extensions 890 can extend toward each other, reducing effective length of the substantially undoped channel 811.

In FIG. 8A, the DDC transistor 870 is shown as an n-channel transistor having a source 884 and drain 886 made of n-type dopant material, formed upon a substrate such as a p-type doped silicon substrate providing a p-well 817. In addition, the n-channel DDC transistor 870 in FIG. 8A can include a highly doped screening region 815 made of p-type dopant material, a threshold voltage set region 813 made of p-type dopant material, a tap 883 for biasing p-well 817, and gate electrode sidewalls 892.

FIG. 8B shows a FinFET type transistor 870-B which can be included in embodiments. The FinFET transistor 870-B can include a gate electrode 882-B and gate dielectric 888-B that surround a substantially undoped channel 811-B on opposing sides. The view of FIG. 8B is taken along a channel length. Thus, it is understood that source and drain regions can extend into and out of the view shown.

FIG. 8C shows a FinFET type transistor 870-C having a screening region 815-C which can be included in embodiments. As in the case of FIG. 8A, the FinFET transistor 870-C has a screening region that can be configured to have an enhanced body coefficient, along with the ability to set a Vt with enhanced precision. The transistor 870-C includes a gate electrode 882-C and gate dielectric 888-C formed over a substantially undoped channel 811-C on opposing sides. However, unlike FIG. 8B, a highly doped screening region 815-C can be formed in a substrate 819 below substantially undoped channel 811-C. Optionally, a Vt set region 813-C can be formed between the screening region 815-C and substantially undoped channel 811-C.

As in the case of FIG. 8B, the view of FIG. 8C is taken along a channel length, and source and drain regions can extend into and out of the view, separated from screening region 815-C by portions of undoped channel region 811-C.

Figure 9:
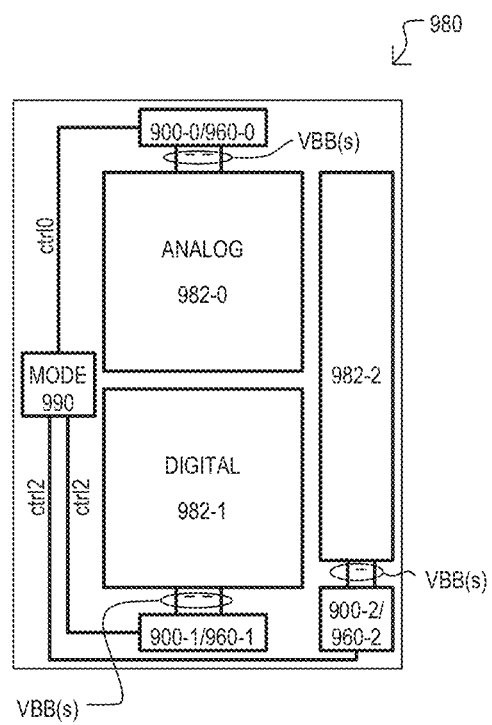
FIG. 9 is a top plan view of an integrated circuit device according to an embodiment.

FIG. 9 shows an integrated circuit device 980 according to an embodiment. IC device 980 can include multiple sections (three shown as 982-0 to -2), each of which can include transistors formed in substrate portions. In the very particular embodiment shown, section 982-0 can include analog circuits, section 982-1 can include digital circuits, and section 982-2 can include input/output (I/O) circuits. However, in other embodiments other section types can be included, and/or there can be multiple sections of the same type.

Each section can have one or more of its substrate portions biased between forward and reverse body biases, as described herein or equivalents. Accordingly, there can be a bi-directional body bias circuit (900-0 to -2) and/or an ABB circuit (960-0 to -2) corresponding to each section (982-0 to -2). Each bi-directional biasing circuit (900-0 to -2) and/or ABB circuit (960-0 to -2) can provide one or more bi-directional body biasing voltage to its corresponding section (982-0 to 982-2).

In the embodiment shown, IC device 980 can include a mode circuit 990 that can change target biasing voltage for each section 982-0 to -2 in response to one or more preconditions, such as desired mode and/or operating conditions, as but two of many possible preconditions.

It is understood that, with appropriate change to substrate or dopant material, conductivities of any of the transistors described above can be switched (i.e., from p-channel to n-channel and vice versa).

Bi-directional body bias generator circuits as described herein, and equivalents, can be advantageously included in IC devices that are implemented using DDC transistors having an enhanced body coefficient, as compared to conventional nanoscale devices. The response of the DDC transistor can vary within a wider range to a change in the body bias voltage applied to the screening region. More specifically, the enhanced body coefficient of the DDC transistor can allow a broad range of ON-current and OFF-current that depends on the body bias voltage applied to the screening region, as compared to the body bias voltage applied to a conventional device. In addition, the DDC transistors can have a better AVT, i.e., a lower $\sigma V_T$ than conventional devices. The lower $\sigma V_T$ provides a lower minimum operating voltage VDD and a wider range of available nominal values of $V_T$. The enhanced body coefficient of the DDC transistor can also allow a broad range of threshold voltage that depends on the body bias voltage applied to the screening region, as compared to the body bias voltage applied to a conventional device. The screening region allows effective body biasing for enhanced control of the operating conditions of a device or a group of devices to be set by controlling the applied body bias voltage. In addition, different operating conditions can be set for devices or groups of devices as a result of applying different body bias voltages.

As will be understood, wafers and die supporting multiple transistor types, including those with and without the described dopant layers and structures are contemplated. Electronic devices that include the disclosed transistor structures or are manufactured in accordance with the disclosed processes can incorporate die configured to operate as "systems on a chip" (SoC), advanced microprocessors, radio frequency, memory, and other die with one or more digital and analog transistor configurations, and are capable of supporting a wide range of applications, including wireless telephones, communication devices, "smart phones", embedded computers, portable computers, personal computers, servers, and other electronic devices. Electronic devices can optionally include both conventional transistors and transistors as disclosed, either on the same die or connected to other die via motherboard, electrical or optical interconnect, stacking or through used of 3D wafer bonding or packaging. According to the methods and processes discussed herein, a system having a variety of combinations of analog and/or digital transistor devices, channel lengths, and strain or other structures can be produced.

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. An integrated circuit device, comprising:
   at least a first bi-directional biasing circuit that includes
   a first substrate portion containing a plurality of first transistors;
   a first control digital-to-analog converter (DAC) to generate any of a plurality of first target values in response to a first target code;
   a first detect circuit configured to generate a difference value between the first target values and a first limit value; and
   at least a first charge pump circuit configured to drive the first substrate portion between a forward body bias voltage and a reverse body bias voltage for the first transistors in response to the first target values.

2. The integrated circuit device of claim 1, wherein:
the first detect circuit is selected from a transconductance amplifier that generates a current difference value and a voltage amplifier that generates a voltage difference value.

3. The integrated circuit device of claim 1, wherein:
the at least first charge pump circuit includes
a pump controller that generates periodic control values, and
a charge pump that drives the first substrate portion between the forward and reverse body bias voltages in response to the periodic control values.

4. The integrated circuit device of claim 1, further including:
a first reference DAC configured to generate the first limit value from a plurality of limit values in response to limit codes.

5. The integrated circuit device of claim 1, wherein:
the integrated circuit device is coupled to receive a high supply voltage (VDD);
the first substrate portion comprises n-type semiconductor; and
the forward body bias voltage is less than VDD and the reverse body bias voltage is greater than VDD.

6. The integrated circuit device of claim 1, wherein:
the integrated circuit device is coupled to receive a low supply voltage (VSS);
the first substrate portion comprises p-type semiconductor; and
the forward body bias voltage is greater than VSS and the reverse body bias voltage is less than VSS.

7. The integrated circuit device of claim 1, further including:
a second bi-directional biasing circuit that includes
a second substrate portion containing a plurality of second transistors;
a second charge pump circuit coupled to the second substrate portion;
a second control DAC to generate any of a plurality of second target values in response to a second target code;
a second detect circuit configured to generate a difference value between the second target values and a second limit value; and
the second charge pump circuit configured to drive the second substrate portion between a second forward body bias voltage and a second reverse body bias voltage for the second transistors in response to the second target values.

8. The integrated circuit device of claim 1, wherein:
at least some of the transistors have an enhanced body coefficient by way of a doped region having a dopant concentration of greater than $1\times10^{18}$ dopant atoms/cm$^3$.

9. An integrated circuit device, comprising:
at least a first bi-directional biasing circuit configured to drive a first substrate portion containing first transistors to a driven body bias voltage that is between a reverse body bias voltage and a forward body bias voltage in response to first code values;
a performance monitor section coupled to at least the first substrate portion and configured to determine a difference between the driven body bias voltage and a first target voltage; and
control logic coupled to at least the first bi-directional biasing circuit and configured to generate the first code values in response to the difference between the driven body bias voltage and the first target voltage.

10. The integrated circuit device of claim 9, further including:
the integrated circuit device receives a low power supply voltage (VSS);
the first substrate portion is a p-type semiconductor region; and
the reverse body bias voltage is less than VSS and the forward body bias voltage is greater than VSS.

11. The integrated circuit device of claim 10, further including:
the integrated circuit device receives a high power supply voltage (VDD);
a second bi-directional biasing circuit configured to drive an n-type semiconductor region to a second driven body bias voltage between a p-type reverse body bias voltage, greater than VDD, and a p-type forward body bias voltage, less than VDD, in response to second code values;
the performance monitor section is further coupled to the n-type semiconductor region and configured to determine a difference between the second driven body bias voltage and a second target voltage; and
the control logic is further coupled to the second bi-directional biasing circuit and configured to generate the second code values in response to the difference between the second driven body bias voltage and the second target voltage.

12. The integrated circuit device of claim 9, wherein:
at least some of said first transistors have an enhanced body coefficient from a doped body below a substantially undoped channel region, the doped body having a dopant concentration of no less than $1\times10^{18}$ dopant atoms/cm$^3$.

13. The integrated circuit device of claim 9, wherein:
the performance monitor section includes
an oscillator circuit configured to generate a performance oscillating signal having a frequency that varies according to the driven body bias voltage; and
a detector configured to generate a detect signal corresponding to a difference between the performance oscillating signal and a target oscillating signal corresponding to the first target voltage.

14. The integrated circuit device of claim 13, wherein:
the control logic includes
a counter circuit configured to generate a count value from the difference between the performance and target oscillating signals; and
DAC control logic configured to generate at least the first code values in response to the count value from the counter circuit.

15. The integrated circuit device of claim 9, further including:
a plurality of sections, each including second transistors formed in different second substrate portions;
a different bi-directional biasing circuit coupled to each second substrate portion, and configured to drive its second substrate portion between second reverse and second forward body bias voltages in response to received second code values; and
the control logic also generates the second code values for the different bi-directional biasing circuit.

16. The integrated circuit device of claim 15, wherein:
the sections are selected from the group of: digital circuits, analog circuits, input/output circuits, and sections with transistors having different structures from one another.

17. An integrated circuit device, comprising:
a bi-directional body bias generator configured to generate forward and reverse body bias voltages for a plurality of transistors, including
 a first digital-to-analog converter (DAC) configured to determine a first current flowing through a first load to generate a first voltage,
 a second DAC configured to determine a second current flowing through a second load to generate a second voltage,
 an amplifier configured to generate a detect value in response to the first and second voltages,
 an oscillator coupled to receive the detect value and generate a plurality of clock signals, and
 at least one charge pump configured to generate either the forward or reverse body bias voltage in response to at least one of the clock signals.

18. The integrated circuit device of claim 17, wherein:
the amplifier is selected from the group consisting of: a transconductance amplifier and a voltage amplifier.

19. The integrated circuit device of claim 17, wherein:
the oscillator is selected from the group consisting of: a current controlled oscillator and a voltage controlled oscillator.

20. The integrated circuit device of claim 17, wherein:
the first load is coupled between an output node and the first DAC; and
the at least one charge pump generates the forward or reverse body bias voltage at the output node.

* * * * *